US008987696B2

(12) United States Patent
Sonehara et al.

(10) Patent No.: US 8,987,696 B2
(45) Date of Patent: Mar. 24, 2015

(54) RESISTANCE CHANGE MEMORY AND METHOD OF MANUFACTURING THE SAME

(71) Applicant: Kabushiki Kaisha Toshiba, Tokyo (JP)

(72) Inventors: Takeshi Sonehara, Kawasaki (JP); Nobuaki Yasutake, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/935,920

(22) Filed: Jul. 5, 2013

(65) Prior Publication Data

US 2013/0292627 A1 Nov. 7, 2013

Related U.S. Application Data

(63) Continuation of application No. 12/888,132, filed on Sep. 22, 2010, now Pat. No. 8,507,887.

(30) Foreign Application Priority Data

Mar. 25, 2010 (JP) ................................. 2010-069098

(51) Int. Cl.
*H01L 29/02* (2006.01)
*H01L 21/82* (2006.01)
(Continued)

(52) U.S. Cl.
CPC .............. *H01L 45/12* (2013.01); *H01L 27/224* (2013.01); *H01L 27/226* (2013.01); *H01L 27/24* (2013.01); *H01L 45/16* (2013.01); *H01L 27/1021* (2013.01); *H01L 29/861* (2013.01); *H01L 29/872* (2013.01)
USPC .................. 257/2; 257/E21.04; 257/E29.003; 438/128

(58) Field of Classification Search
CPC ... H01L 45/06; H01L 45/1233; H01L 45/144; H01L 45/126; H01L 27/2409
See application file for complete search history.

(56) References Cited

U.S. PATENT DOCUMENTS 5,300,455 A * 4/1994 Vuillermoz et al. .......... 438/653
7,911,823 B2   3/2011 Futatsuyama et al.
(Continued)

FOREIGN PATENT DOCUMENTS

JP   2007-184419   7/2007
JP   2009-517864   4/2009
(Continued)

OTHER PUBLICATIONS

Japanese Office Action issued Aug. 21, 2012, in Patent Application No. 2010-069098.

*Primary Examiner* — Eva Yan Montalvo
*Assistant Examiner* — Kevin Quinto
(74) *Attorney, Agent, or Firm* — Oblon, McClelland, Maier & Neustadt, L.L.P.

(57) ABSTRACT

According to one embodiment, a resistance change memory includes a first interconnect line extending in a first direction, a second interconnect line extending in a second direction intersecting with the first direction, a cell unit which is provided at the intersection of the first interconnect line and the second interconnect line and which includes a memory element and a non-ohmic element that are connected in series. The non-ohmic element has a first semiconductor layer which includes at least one diffusion buffering region and a conductive layer adjacent to the first semiconductor layer. The diffusion buffering region is different in crystal structure from a semiconductor region except for the diffusion buffering region in the first semiconductor layer.

15 Claims, 21 Drawing Sheets

(51) Int. Cl.
  *H01L 45/00*  (2006.01)
  *H01L 27/22*  (2006.01)
  *H01L 27/24*  (2006.01)
  *H01L 27/102* (2006.01)
  *H01L 29/861* (2006.01)
  *H01L 29/872* (2006.01)

(56) References Cited

U.S. PATENT DOCUMENTS

| | | |
|---|---|---|
| 2006/0006495 A1 | 1/2006 | Herner et al. |
| 2008/0119007 A1* | 5/2008 | Raghuram et al. ............ 438/99 |
| 2008/0291716 A1 | 11/2008 | Futatsuyama et al. |
| 2009/0140233 A1 | 6/2009 | Kinoshita et al. |
| 2009/0243002 A1 | 10/2009 | Sonehara et al. |
| 2010/0230721 A1 | 9/2010 | Yasutake |
| 2010/0321979 A1 | 12/2010 | Yasutake et al. |
| 2011/0127483 A1 | 6/2011 | Sonehara |

FOREIGN PATENT DOCUMENTS

| | | |
|---|---|---|
| JP | 2009-123725 | 6/2009 |
| WO | WO 2009/005700 A2 | 1/2009 |

* cited by examiner

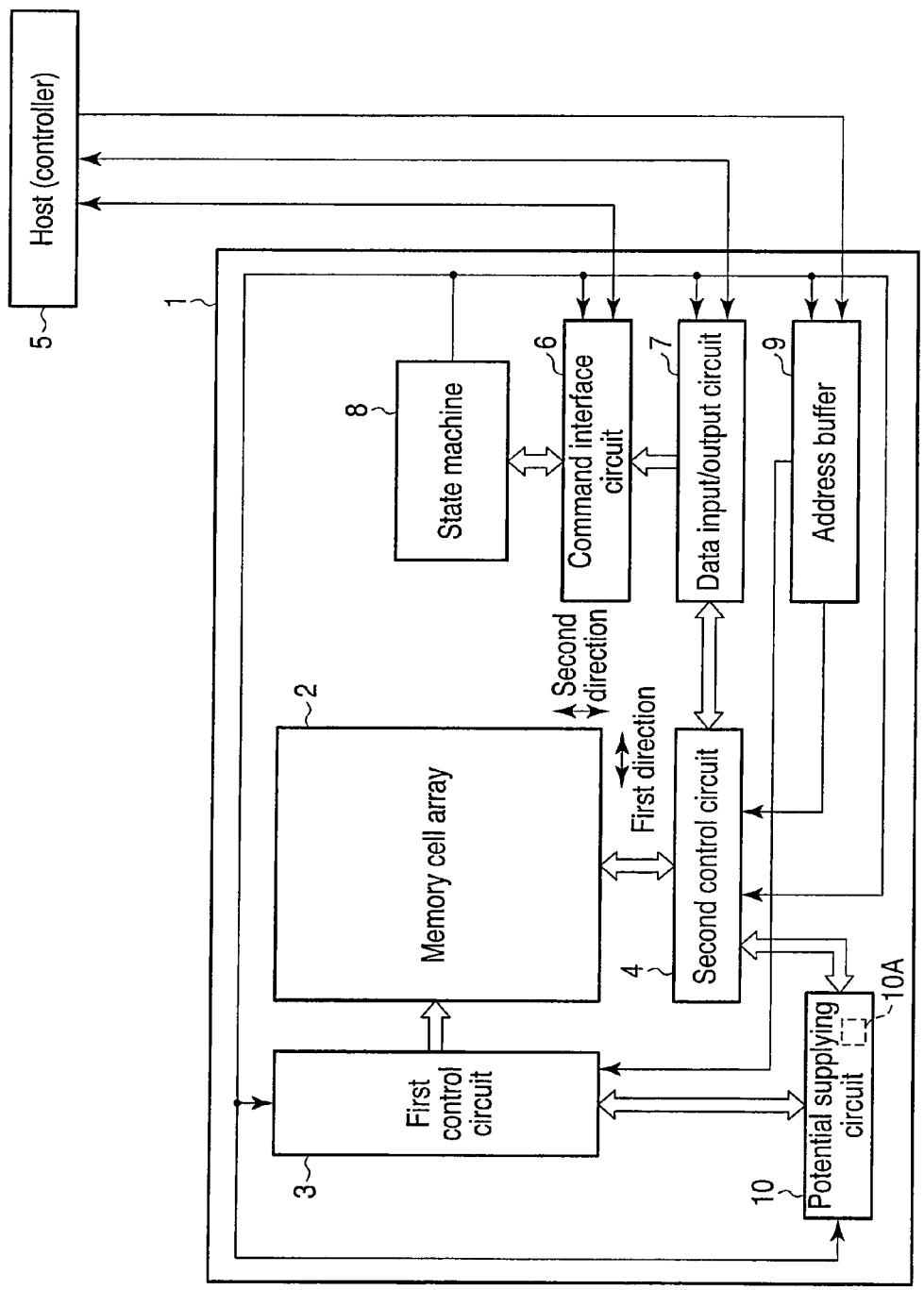
F I G. 1

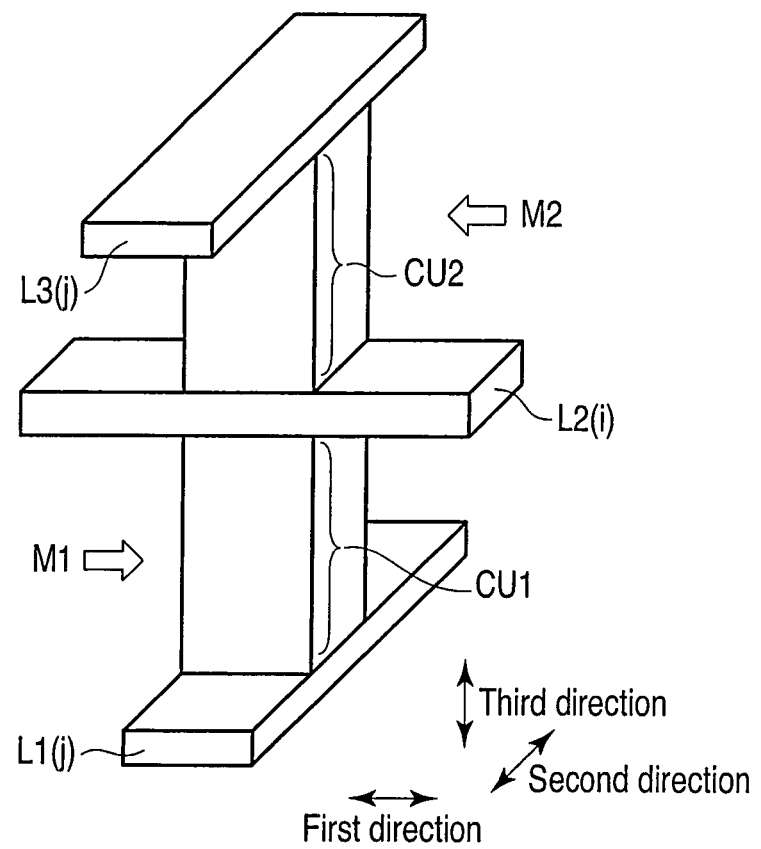
F I G. 3

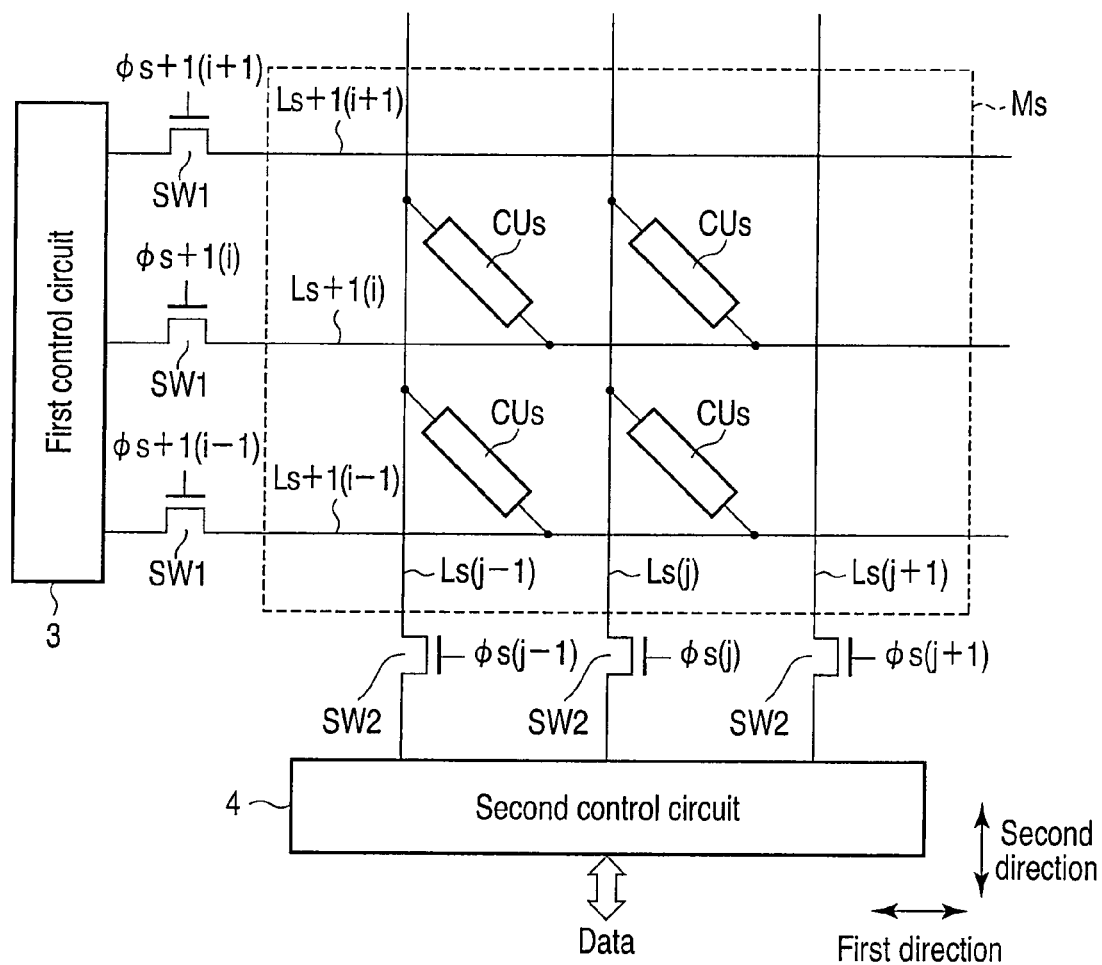
F I G. 5A

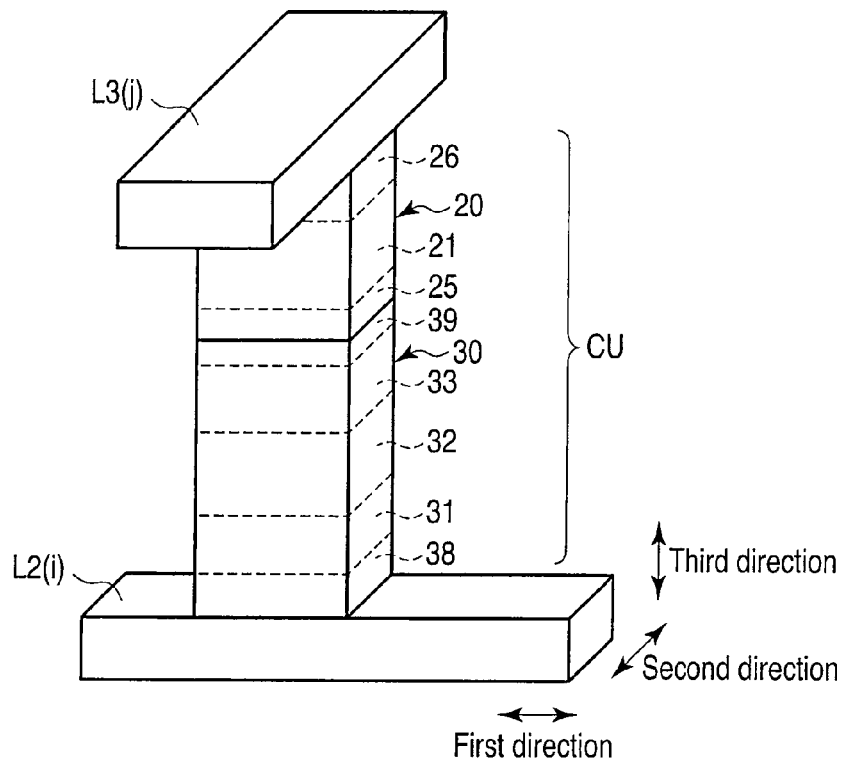
F I G. 8
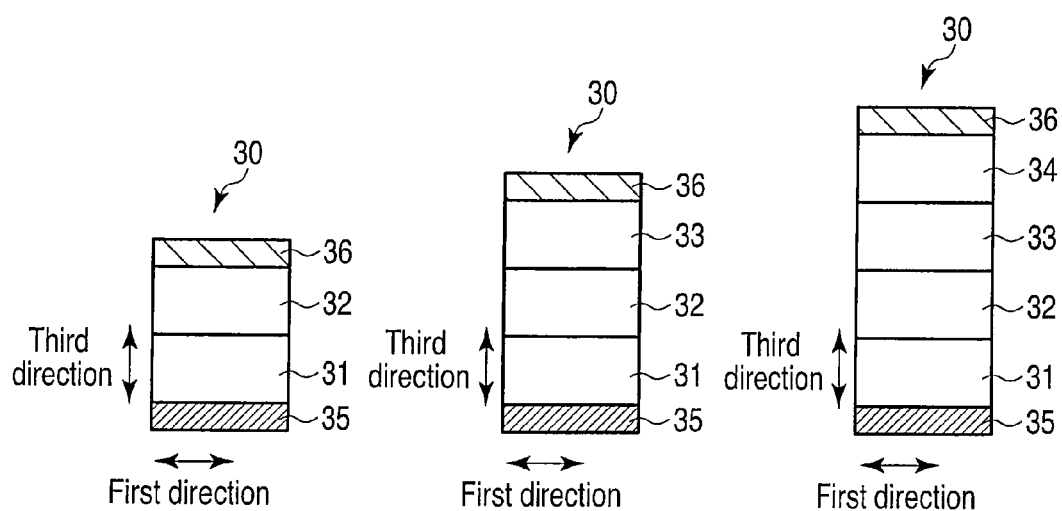
F I G. 9A     F I G. 9B     F I G. 9C

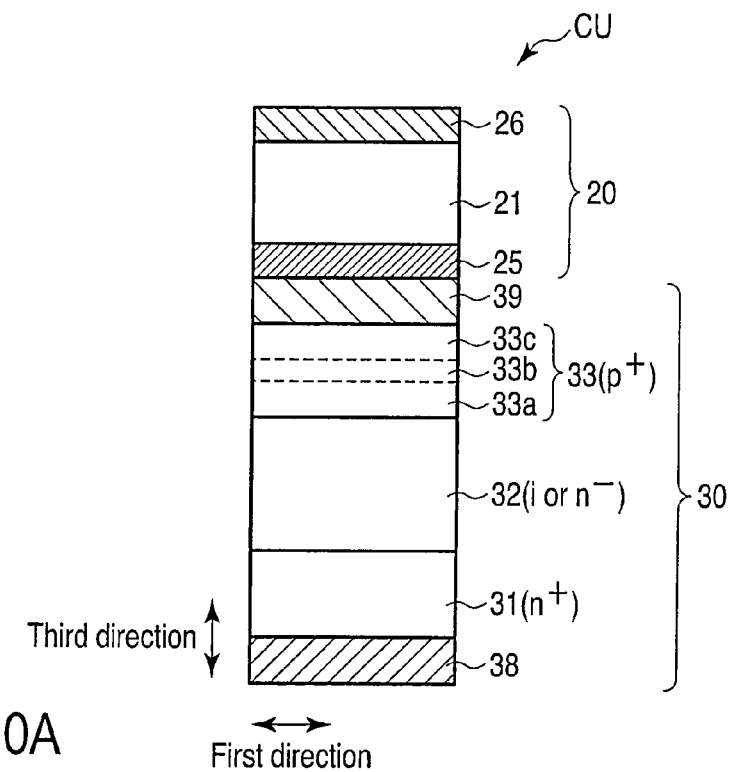
F I G. 10A
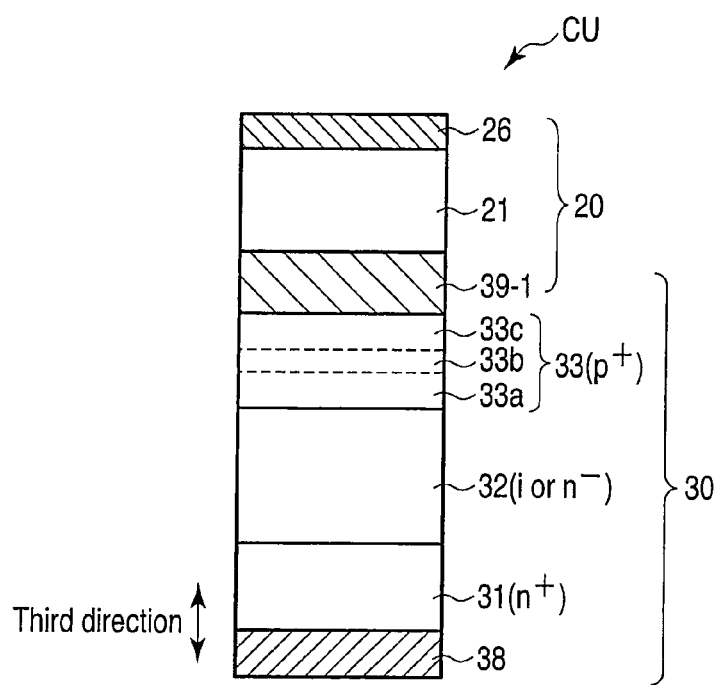
F I G. 10B

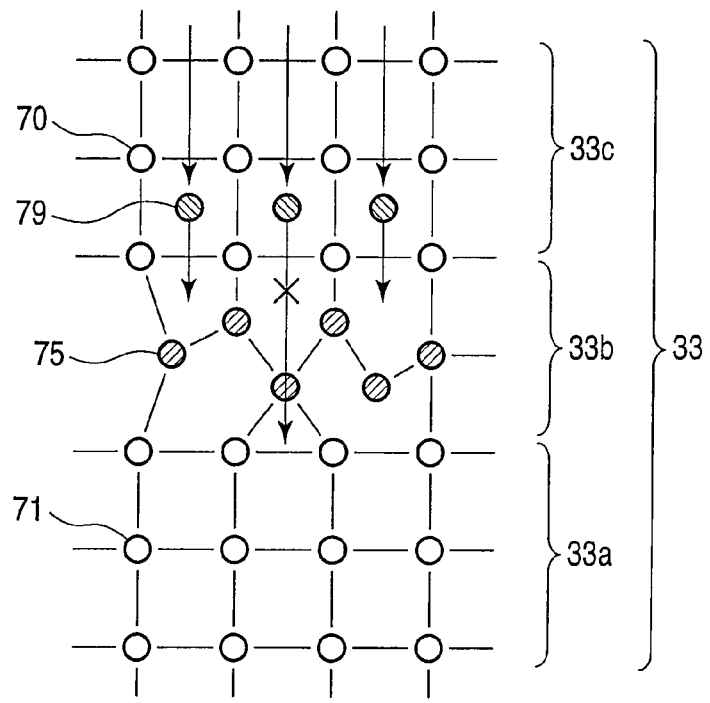
F I G. 13B
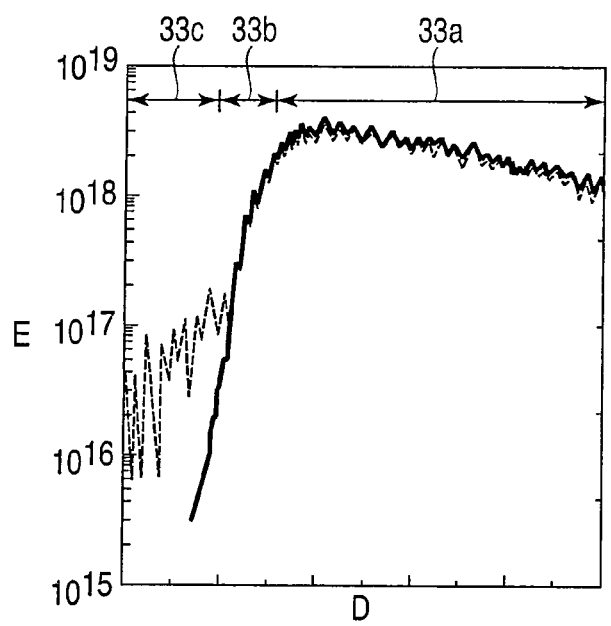
F I G. 14

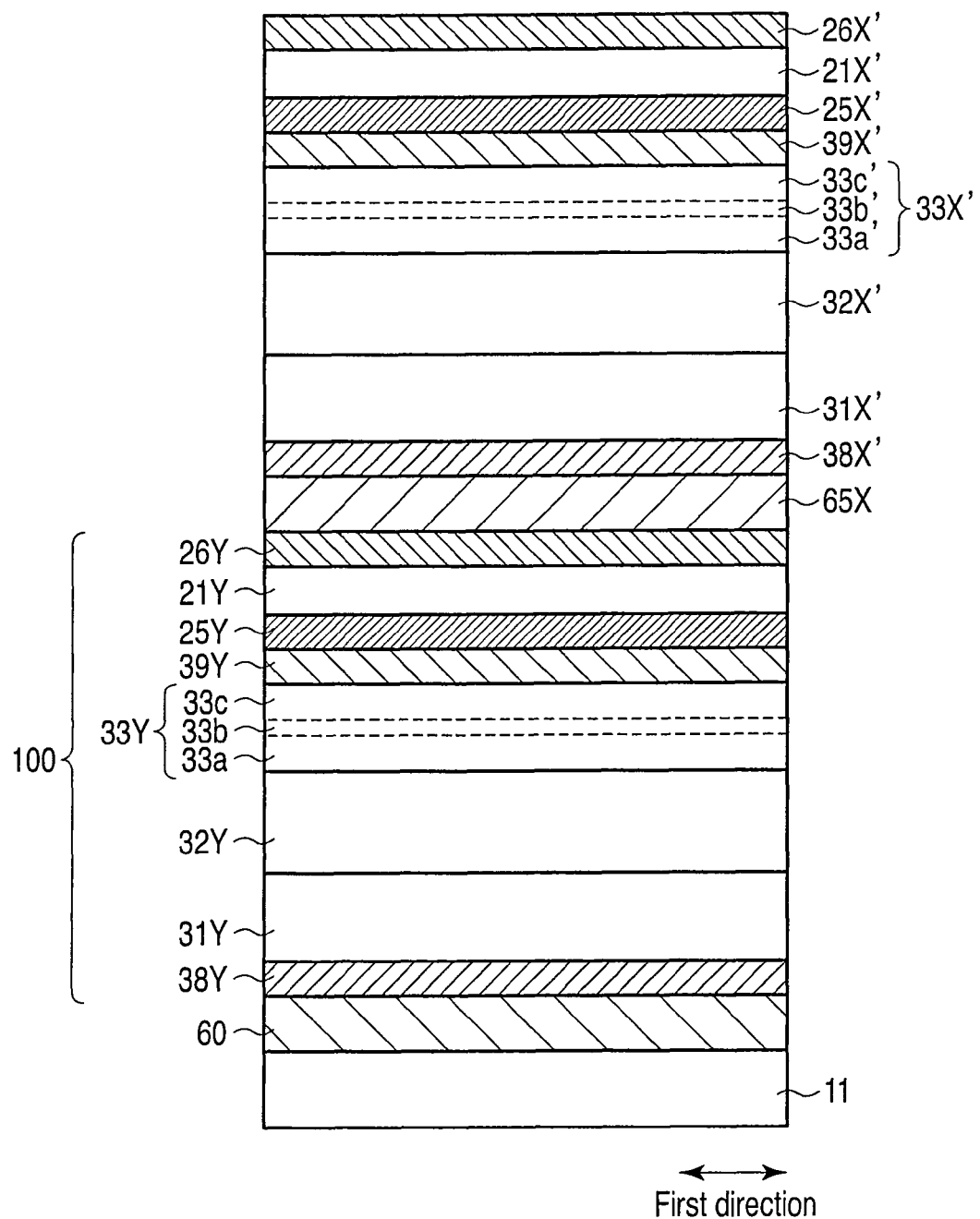
F I G. 15F

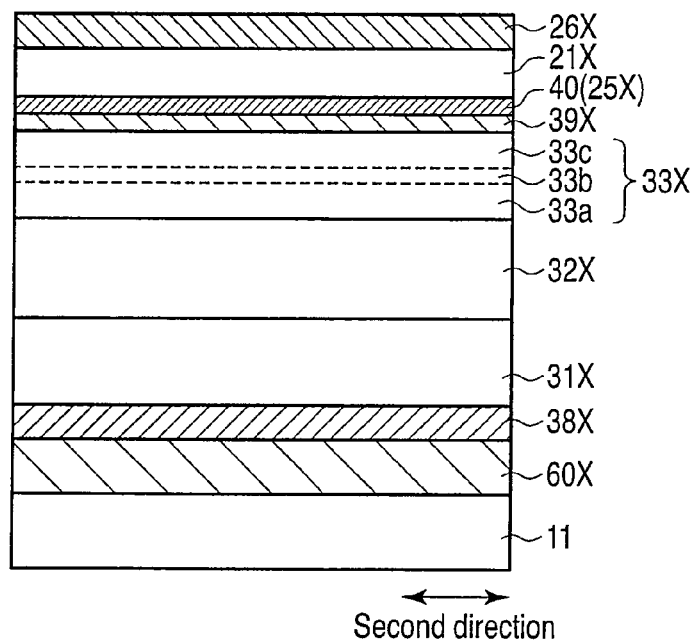
F I G. 16A
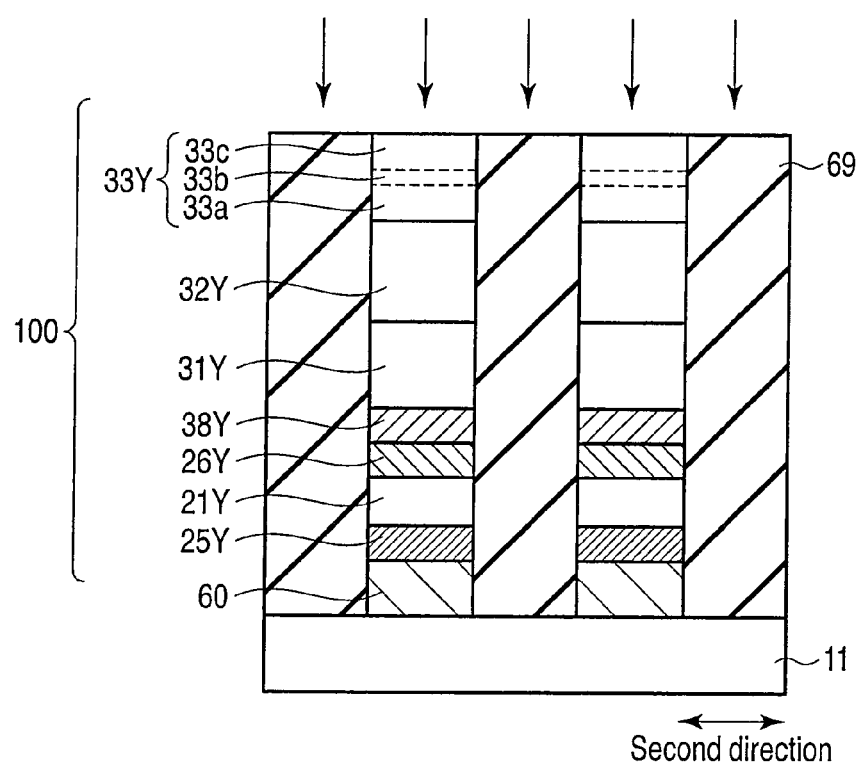
F I G. 16B

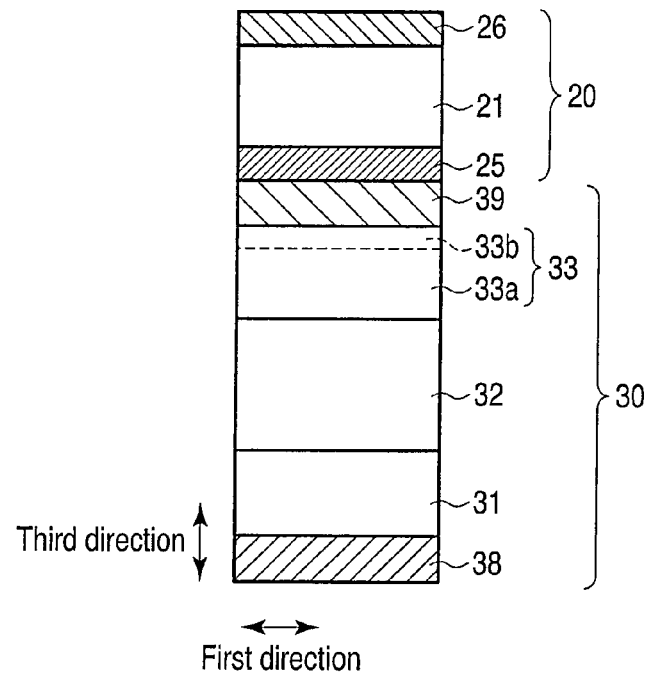
F I G. 17
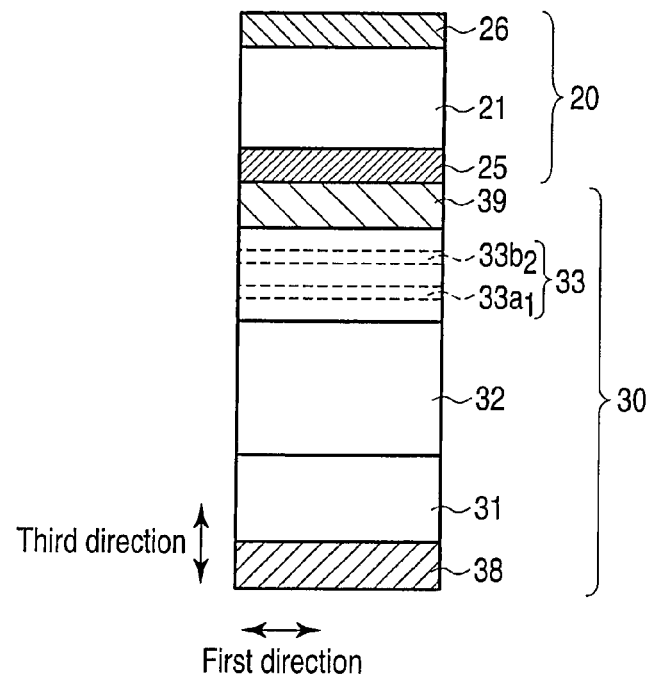
F I G. 18

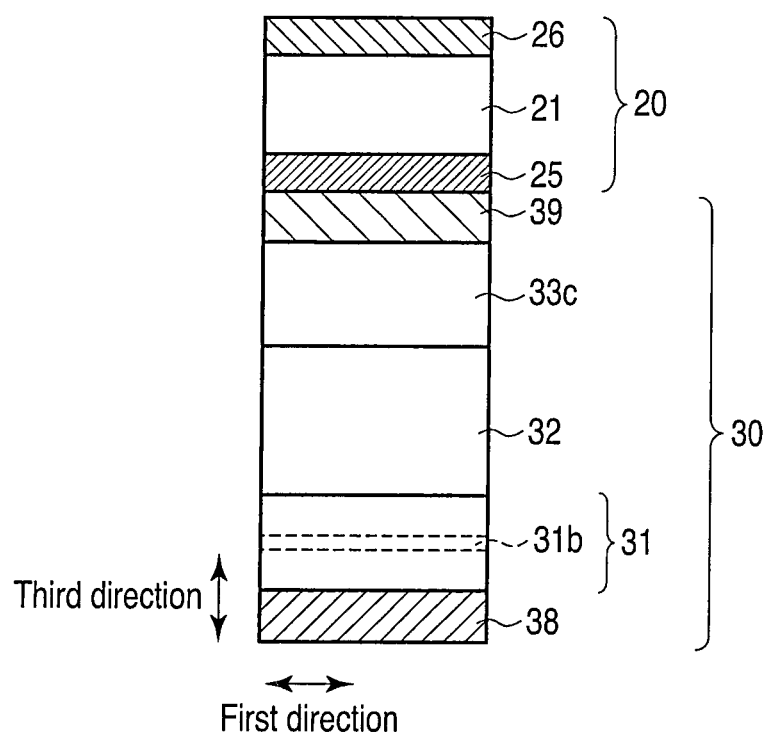
F I G. 19

RESISTANCE CHANGE MEMORY AND METHOD OF MANUFACTURING THE SAME

CROSS-REFERENCE TO RELATED APPLICATIONS

This application is a continuation of U.S. application Ser. No. 12/888,132, filed Sep. 22, 2010, which is based upon and claims the benefit of priority from Japanese Patent Application No. 2010-069098, filed Mar. 25, 2010; the entire contents of each of which are incorporated herein by reference.

FIELD

Embodiments described herein relate generally to a resistance change memory.

BACKGROUND

Recently, as next-generation nonvolatile semiconductor memories, resistance change memories have been attracting attention, such as a resistive RAM (ReRAM) in which a variable resistive element serves as a memory element, and a phase change RAM (PCRAM) in which a phase change element serves as a memory element.

These resistance change memories are characterized in that a memory cell array is a cross-point type and a higher memory capacity is thus enabled by three-dimensional integration, and also characterized by being capable of the same high-speed operation as that of a DRAM.

In the resistance change memory, the cross-point type memory cell array includes a plurality of cell units. The cell unit includes a memory element and a non-ohmic element (e.g., see Jpn. Pat. Appln. KOKAI Publication No. 2009-123725).

Such a resistance change memory, when put into practical use, can replace, for example, a NAND flash memory as a file memory and a DRAM as a work memory.

However, in order to put the resistance change memory into practical use, characteristics of the non-ohmic element have to be improved.

BRIEF DESCRIPTION OF THE DRAWINGS

FIG. 1 is a diagram showing an example of the configuration of a resistance change memory;

FIG. 3 is a diagram showing cell units;

FIG. 5A is a diagram showing the layout of first and second control circuits;

FIG. 8 is a diagram showing an example of the structure of the cell unit in the resistance change memory according to an embodiment;

FIG. 9A is a diagram showing an example of the structure of a non-ohmic element included in the cell unit;

FIG. 9B is a diagram showing an example of the structure of the non-ohmic element included in the cell unit;

FIG. 9C is a diagram showing an example of the structure of the non-ohmic element included in the cell unit;

FIG. 10A is a sectional view showing the structure of the cell unit in the resistance change memory according to the embodiment;

FIG. 10B is a sectional view showing the structure of the cell unit in the resistance change memory according to the embodiment;

FIG. 13B is a diagram for illustrating the principle of the non-ohmic element according to the embodiment;

FIG. 14 is a graph for illustrating the advantage of the non-ohmic element according to the embodiment;

FIG. 15F is a diagram showing one step of the method of manufacturing the resistance change memory according to the embodiment;

FIG. 16A is a diagram showing one step of the method of manufacturing the resistance change memory according to the embodiment;

FIG. 16B is a diagram showing one step of the method of manufacturing the resistance change memory according to the embodiment;

FIG. 17 is a diagram showing a modification of the cell unit in the resistance change memory according to the embodiment;

FIG. 18 is a diagram showing a modification of the cell unit in the resistance change memory according to the embodiment; and FIG. 19 is a diagram showing a modification of the cell unit in the resistance change memory according to the embodiment.

DETAILED DESCRIPTION

Figure 2:
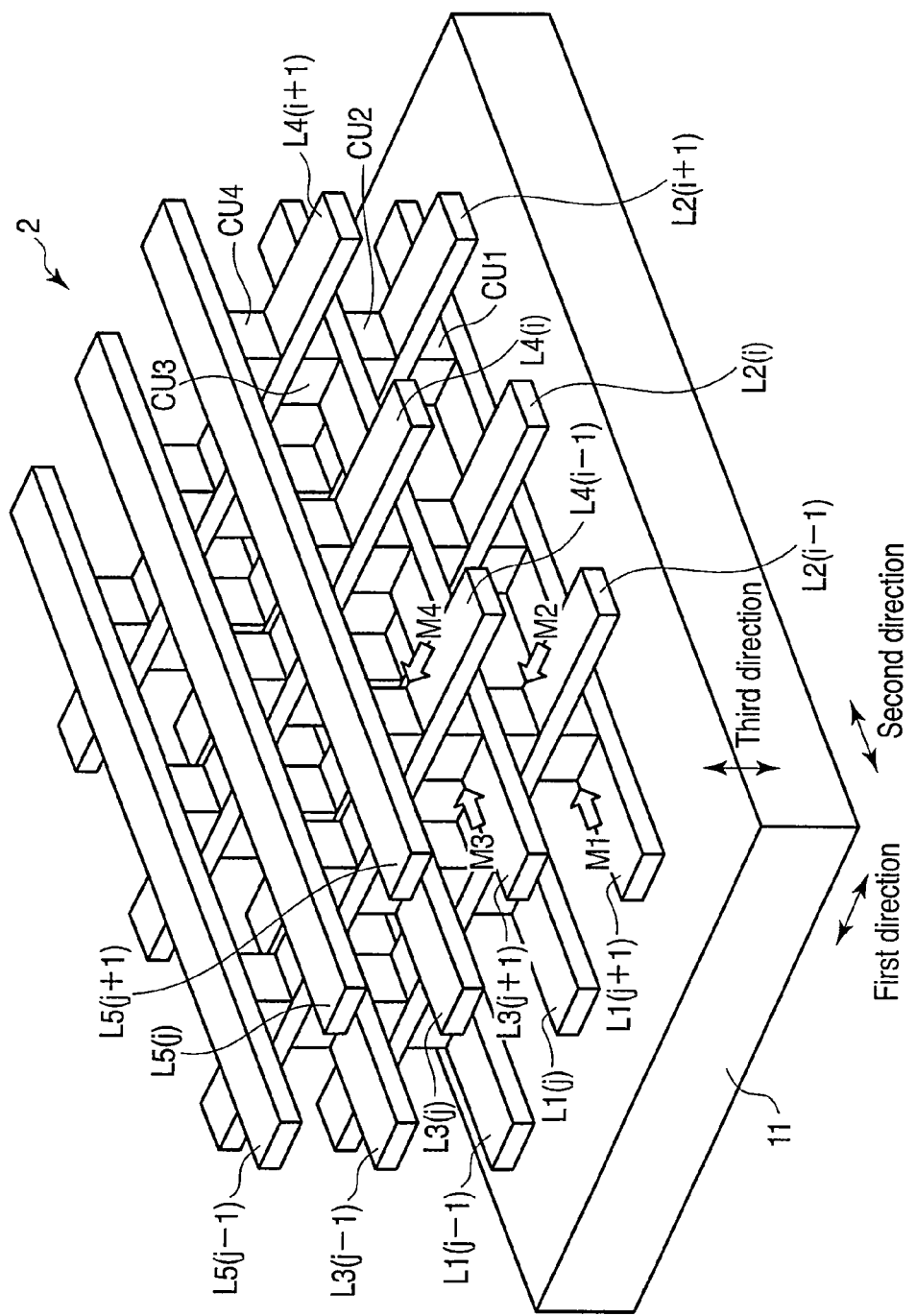
FIG. 2 is a diagram showing a cross-point type memory cell array.

Hereinafter, present embodiments will be described in detail with reference to the drawings. In the following explanation, components provided with the same signs are repeatedly described when necessary.

In general, according to one embodiment, a resistance change memory includes a first interconnect line extending in a first direction; a second interconnect line extending in a second direction intersecting with the first direction; a cell unit which is provided at the intersection of the first interconnect line and the second interconnect line and which includes a memory element and a non-ohmic element that are connected in series; the non-ohmic element having a first semiconductor layer which includes at least one diffusion buffering region and a conductive layer adjacent to the first semiconductor layer. The diffusion buffering region is different in crystal structure from a semiconductor region except for the diffusion buffering region in the first semiconductor layer.

The present embodiments are directed to a resistance change memory in which a variable resistive element or a phase change element serves as a memory element.

[Embodiment]

(1) Resistance Change Memory (a) Overall Configuration

A resistance change memory according to an embodiment is described with FIG. 1 to FIG. 7.

FIG. 1 shows the main parts of the resistance change memory.

A resistance change memory (e.g., a chip) 1 has a cross-point type memory cell array 2.

For example, a first control circuit 3 is disposed at one end in the first direction of the cross-point type memory cell array 2, and a second control circuit 4 is disposed at one end in the second direction that intersects with the first direction.

The first control circuit 3 selects a row of the cross-point type memory cell array 2 on the basis of, for example, a row address signal. The second control circuit 4 selects a column of the cross-point type memory cell array 2 on the basis of, for example, a column address signal.

The first and second control circuits 3, 4 control writing, erasing and reading of data in a memory element within the memory cell array 2.

Here, in the resistance change memory 1 according to the present embodiment, for example, a write is referred to as a set, and an erasure is referred to as a reset. A resistance value in a set state has only to be different from a resistance value in a reset state, and whether the resistance value in the set state is higher or lower than that in the reset state makes no difference.

Moreover, if one of a plurality of levels of resistance values that can be marked by the memory element can be selectively written in a set operation, a multilevel resistance change memory in which one memory element stores multilevel data can be obtained.

A controller 5 supplies a control signal and data to the resistance change memory 1. The control signal is input to a command interface circuit 6, and the data is input to a data input/output buffer 7. The controller 5 may be disposed in the chip 1 or may be disposed in a chip (host device) different from the chip 1.

The command interface circuit 6 judges in accordance with the control signal whether data from the controller 5 is command data. When the data is command data, the command interface circuit 6 transfers the command data from the input/output buffer 7 to a state machine 8.

The state machine 8 manages the operation of the resistance change memory 1 on the basis of the command data. For example, the state machine 8 manages the set/reset operations and read operation on the basis of command data from the controller 5. The controller 5 can receive status information managed by the state machine 8, and judge the result of the operation in the resistance change memory 1.

In the set/reset operations and read operation, the controller 5 supplies an address signal to the resistance change memory 1. The address signal is input to the first and second control circuits 3, 4 via an address buffer 9.

A potential supplying circuit 10 outputs, with predetermined timing, a voltage pulse or current pulse necessary for, for example, the set/reset operations and read operation in accordance with an instruction from the state machine 8. The potential supplying circuit 10 includes, for example, a pulse generator, and controls, in accordance with the operation indicated by the command data and control signal, the voltage value/current value of an output voltage pulse/current pulse, and the pulse width.

FIG. 2 is a bird's-eye view showing the structure of the cross-point type memory cell array.

The cross-point type memory cell array 2 is disposed on a substrate 11. The substrate 11 is a semiconductor substrate (e.g., a silicon substrate), or an interlayer insulating film on a semiconductor substrate. In addition, when the substrate 11 is an interlayer insulating film, a circuit that uses, for example, a field effect transistor may be formed as a peripheral circuit of the resistance change memory on the surface of a semiconductor substrate under the cross-point type memory cell array 2.

The cross-point type memory cell array 2 includes, for example, a stack structure of a plurality of memory cell arrays (also referred to as memory cell layers).

FIG. 2 shows, by way of example, the case where the cross-point type memory cell array 2 is composed of four memory cell arrays M1, M2, M3, M4 that are stacked in the third direction (a direction perpendicular to the main plane of the substrate 11). The number of memory cell arrays stacked has only to be two or more. In addition, the cross-point type memory cell array 2 may be configured by one memory cell array. Alternatively, an insulating film may be provided between two memory cell arrays stacked, and the two memory cell arrays may be electrically isolated by the insulating film.

When the plurality of memory cell arrays M1, M2, M3, M4 are stacked as in FIG. 2, the address signal includes, for example, a memory cell array selection signal, a row address signal and a column address signal. The first and second control circuits 3, 4 select one of the stacked memory cell arrays in accordance with, for example, the memory cell array selection signal. The first and second control circuits 3, 4 can write/erase/read data in one of the stacked memory cell arrays, or can simultaneously write/erase/read data in two or more or all of the stacked memory cell arrays.

The memory cell array M1 includes a plurality of cell units CU1 arrayed in the first and second directions. Similarly, the memory cell array M2 includes a plurality of arrayed cell units CU2, the memory cell array M3 includes a plurality of arrayed cell units CU3, and the memory cell array M4 includes a plurality of arrayed cell units Cu4.

Furthermore, on the substrate 11, there are arranged, in order from the side of the substrate 11, interconnect lines L1(j−1), L1(j), L1(j+1), interconnect lines L2(i−1), L2(i), L2(i+1), interconnect lines L3(j−1), L3(j), L3(j+1), interconnect lines L4(i−1), L4(i), L4(i+1), and interconnect lines L5(j−1), L5(j), L5(j+1).

The odd interconnect lines from the side of the substrate 11, that is, the interconnect lines L1(j−1), L1(j), L1(j+1), the interconnect lines L3(j−1), L3(j), L3(j+1) and the interconnect lines L5(j−1), L5(j), L5(j+1) extend in the second direction.

The even interconnect lines from the side of the substrate 11, that is, the interconnect lines L2(i−1), L2(i), L2(i+1) and the interconnect lines L4(i−1), L4(i), L4 (i+1) extend in the first direction that intersects with the second direction.

These interconnect lines are used as word lines or bit lines.

The lowermost first memory cell array M1 is disposed between the first interconnect lines L1(j−1), L1(j), L1(j+1) and the second interconnect lines L2(i−1), L2(i), L2(i+1). In the set/reset operations and read operation for the memory cell array M1, either the interconnect lines L1(j−1), L1(j), L1(j+1) or the interconnect lines L2(i−1), L2(i), L2(i+1) are used as word lines, and the other interconnect lines are used as bit lines.

The memory cell array M2 is disposed between the second interconnect lines L2(i−1), L2(i), L2(i+1) and the third interconnect lines L3(j−1), L3(j), L3(j+1). In the set/reset operations and read operation for the memory cell array M2, either the interconnect lines L2(i−1), L2(i), L2 (i+1) or the interconnect lines L3(j−1), L3(j), L3(j+1) are used as word lines, and the other interconnect lines are used as bit lines.

The memory cell array M3 is disposed between the third interconnect lines L3(j−1), L3(j), L3(j+1) and the fourth interconnect lines L4(i−1), L4(i), L4(i+1). In the set/reset operations and read operation for the memory cell array M3, either the interconnect lines L3(j−1), L3(j), L3 (j+1) or the interconnect lines L4(i−1), L4(i), L4(i+1) are used as word lines, and the other interconnect lines are used as bit lines.

The memory cell array M4 is disposed between the fourth interconnect lines L4(i−1), L4(i), L4(i+1) and the fifth interconnect lines L5(j−1), L5(j), L5(j+1). In the set/reset operations and read operation for the memory cell array M4, either the interconnect lines L4(i−1), L4(i), L4 (i+1) or the interconnect lines L5(j−1), L5(j), L5(j+1) are used as word lines, and the other interconnect lines are used as bit lines.

The cell unit CU1 is disposed at the place where the interconnect lines L1(j−1), L1(j), L1(j+1) intersect with the interconnect lines L2(i−1), L2(i), L2(i+1). In similar fashion, the cell units CU2, CU3, CU4 are respectively disposed at the place where the interconnect lines L2(i−1), L2(i), L2(i+1) intersect with the interconnect lines L3(j−1), L3(j), L3(j+1), at the place where the interconnect lines L3(j−1), L3(j), L3(j+1) intersect with the interconnect lines L4(i−1), L4(i), L4(i+1), and at the place where the interconnect lines L4(i−1), L4(i), L4(i+1) intersect with the interconnect lines L5(j−1), L5(j), L5(j+1). That is, in the cross-point type memory cell array 2, the cell unit is disposed at the intersection of the interconnect lines stacked in succession in the third direction.

When the stack of two memory cell arrays are isolated from each other in the respective layers by the insulating film, the interconnect lines extending in the first and second directions are not shared by the stack of two memory cell arrays, and interconnect lines as word lines and bit lines are provided for each memory cell array.

FIG. 3 shows one example of the structures of the interconnect lines and the cell units in the cross-point type memory cell array.

In FIG. 3, the cell units CU1, CU2 in two memory cell arrays M1, M2 in FIG. 2 are shown. In this case, the cell units in the two memory cell arrays M3, M4 in FIG. 2 are the same in configuration as the cell units in two memory cell arrays M1, M2 in FIG. 2.

The stacked cell units CU1, CU2 share one interconnect line L2(i).

One end of the current path of the cell unit CU1 is connected to the interconnect line L1(j), and the other end of the current path of the cell unit CU1 is connected to the interconnect line L2(i). One end of the current path of the cell unit CU2 is connected to the interconnect line L2(i), and the other end of the current path of the cell unit CU2 is connected to the interconnect line L3(j).

Each of the cell units CU1, CU2 has a memory element and a non-ohmic element. The memory element and the non-ohmic element are connected in series. For example, a rectification element is used for the non-ohmic element.

There are various patterns of the connection between the memory element and the rectification element as the non-ohmic element. However, all the cell units in one memory cell array need to be the same in the connection between the memory element and the rectification element.

Figure 4:
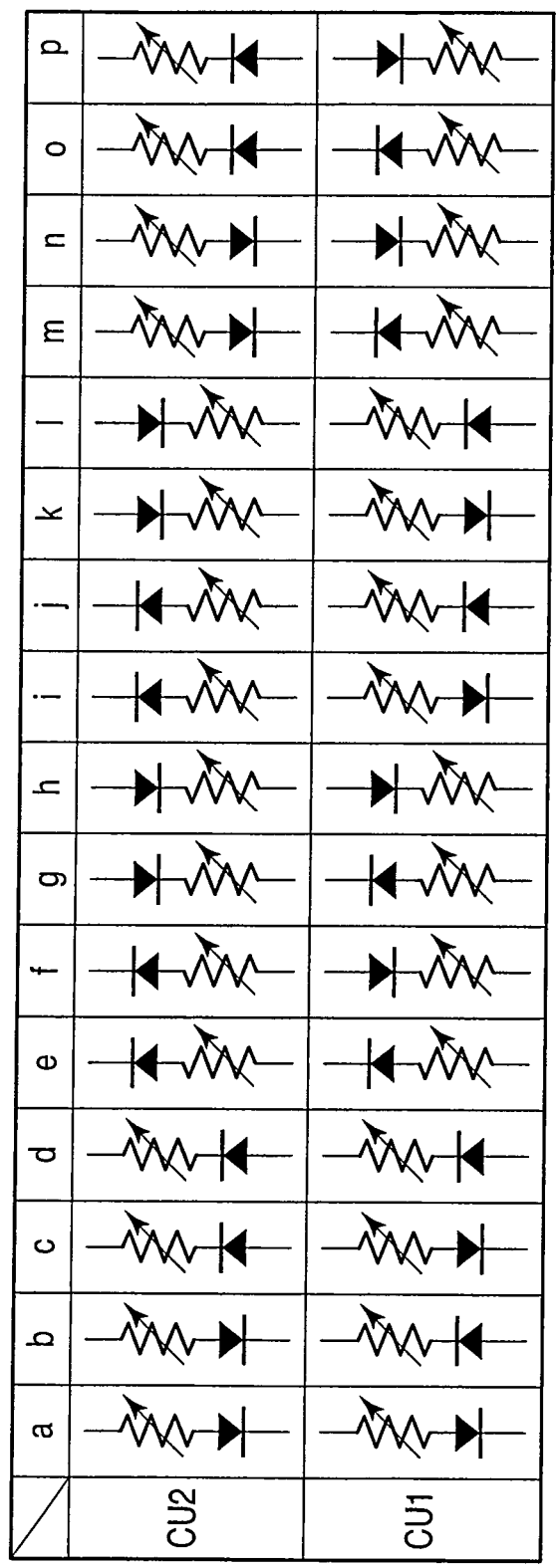
FIG. 4 is a diagram showing the connection between a memory element and a rectification element.

FIG. 4 shows the connection between the memory element and the rectification element.

In one cell unit, there are a total of four patterns of the connection between the memory element and the rectification element; two patterns of the positional relation between the memory element and the rectification element, and two patterns of the direction of the rectification element. Therefore, there are sixteen patterns (four patterns×four patterns) of the connection between the memory element and the rectification element regarding the cell units in two memory cell arrays. "a" to "p" of FIG. 4 denote sixteen patterns of connection. The present embodiment is applicable to all sixteen patterns of connection.

Figure 5B:
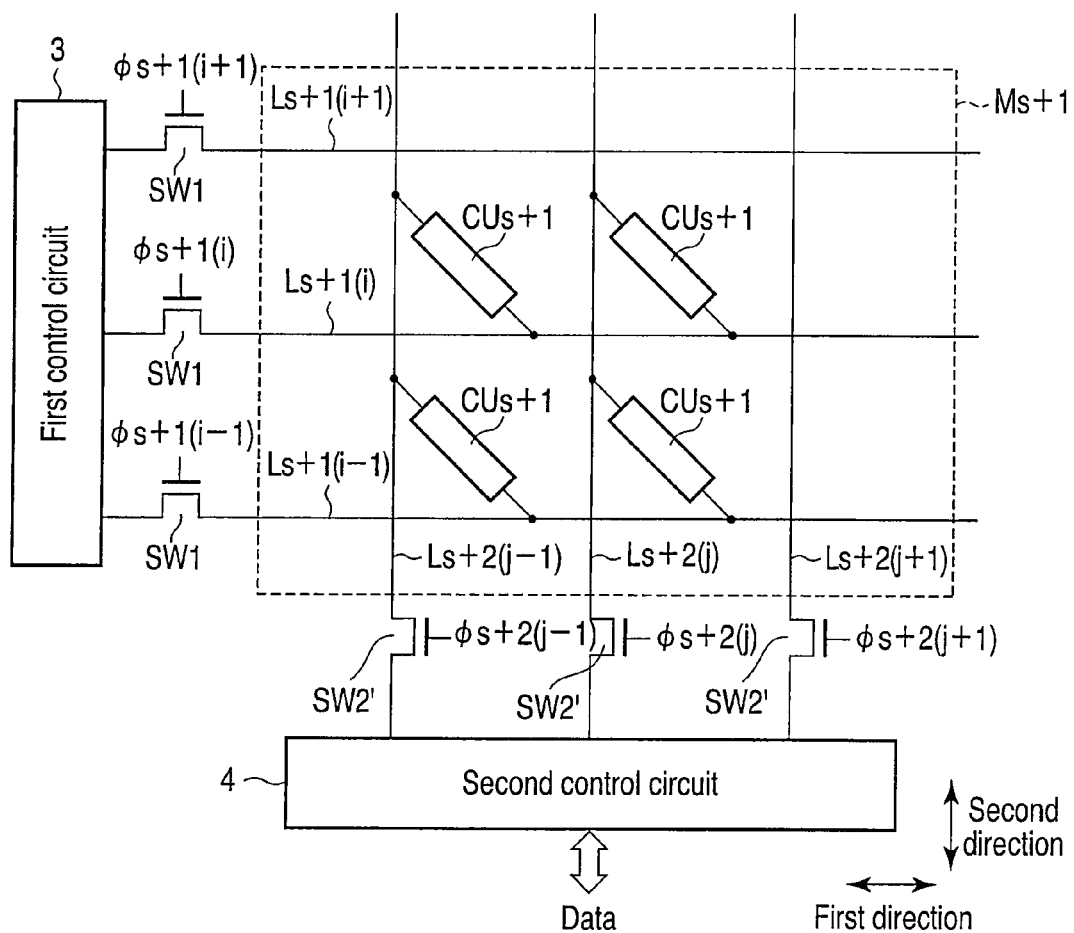
FIG. 5B is a diagram showing the layout of the first and second control circuits.

FIG. 5A and FIG. 5B show a first example of the layout of the first and second control circuits. "s" is 1, 3, 5, 7, . . . in FIG. 5A and FIG. 5B.

A memory cell array Ms in FIG. 5A corresponds to one of the memory cell arrays M1, M2, M3, M4 shown in FIG. 2. As shown in FIG. 5A, the memory cell array Ms includes a plurality of arrayed cell units CUs. The cell units CUs are connected on one end to interconnect lines Ls(j−1), Ls(j), Ls(j+1), and connected on the other end to interconnect lines Ls+1(i−1), Ls+1(i), Ls+1(i+1).

As shown in FIG. 5B, a memory cell array Ms+1 includes a plurality of arrayed cell units CUs+1. The cell units CUs+1 are connected on one end to interconnect lines Ls+1(i−1), Ls+1(i), Ls+1(i+1), and connected on the other end to interconnect lines Ls+2(j−1), Ls+2(j), Ls+2(j+1).

The first control circuit 3 is connected to the interconnect lines Ls+1(i−1), Ls+1(i), Ls+1(i+1) on one end in the first direction via switch elements SW1. The switch elements SW1 are controlled by, for example, control signals φs+1(i−1), φs+1(i), φ+1(i+1). The switch element SW1 is, for example, an N-channel field effect transistor (FET).

The second control circuit 4 is connected to the interconnect lines Ls(j−1), Ls(j), Ls(j+1) on one end in the second direction via switch elements SW2. The switch elements SW2 are controlled by, for example, control signals φs(j−1), φs(j), φs(j+1). The switch element SW2 is, for example, an N-channel FET.

The second control circuit 4 is connected to the interconnect lines Ls+2(j−1), Ls+2(j), Ls+2(j+1) on one end in the second direction via switch elements SW2'. The switch elements SW2' are controlled by, for example, control signals φs+2(j−1), φs+2(j), φs+2(j+1). The switch element SW2' is, for example, an N-channel FET.

Figure 6:
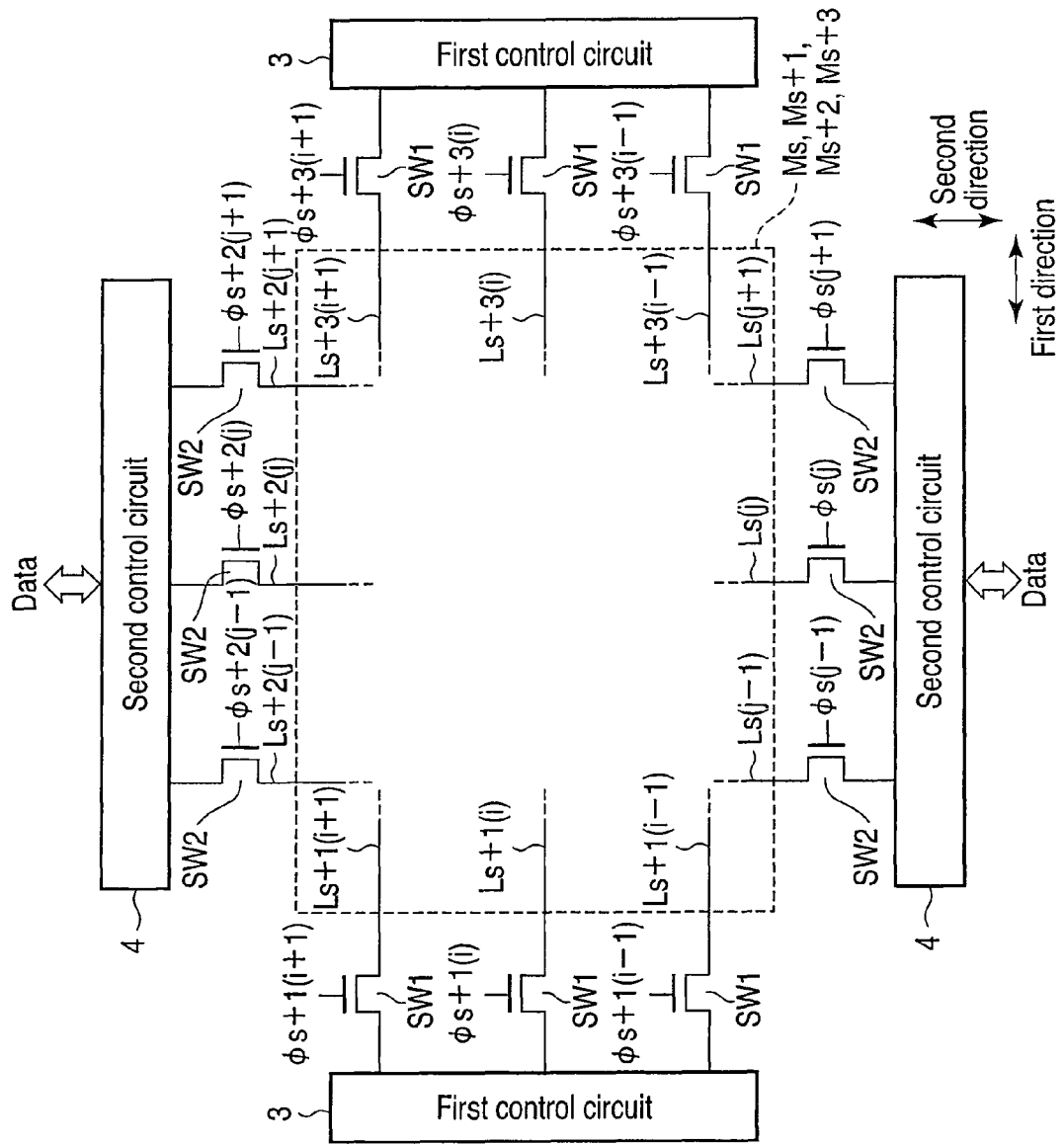
FIG. 6 is a diagram showing the layout of the first and second control circuits.

FIG. 6 shows a second example of the layout of the first and second control circuits. In addition, in FIG. 6, the internal configuration of the memory cell arrays Ms, Ms+1, Ms+2, Ms+3 is substantially the same as that of the memory cell array shown in FIG. 5A or FIG. 5B and is therefore not shown.

The layout in the second example is different from the layout in the first example in that the first control circuits 3 are disposed at both ends in the first direction of the memory cell array Ms, Ms+1, Ms+2, Ms+3 and in that the second control circuits 4 are disposed at both ends in the second direction of the memory cell array Ms, Ms+1, Ms+2, Ms+3. However, s in FIG. 6 is 1, 5, 9, 13, . . . .

The first control circuits 3 are connected to the interconnect lines Ls+1(i−1), Ls+1(i), Ls+1(i+1) on both ends in the first direction via the switch elements SW1. The switch elements SW1 are controlled by, for example, the control signals φs+1(i−1), φs+1(i), φs+1(i+1), φs+3(i−1), 4s+3(1), φs+3(i+1). The switch element SW1 is, for example, an N-channel FET.

The second control circuits 4 are connected to the interconnect lines Ls(j−1), Ls(j), Ls(j+1) on both ends in the second direction via the switch elements SW2.

The switch elements SW2 are controlled by, for example, the control signals φs(j−1), φs(j), φs(j+1), φs+2(j−1), φs+2(j), φs+2(j+1). The switch element SW2 is, for example, an N-channel FET.

(b) Operation

Figure 7:
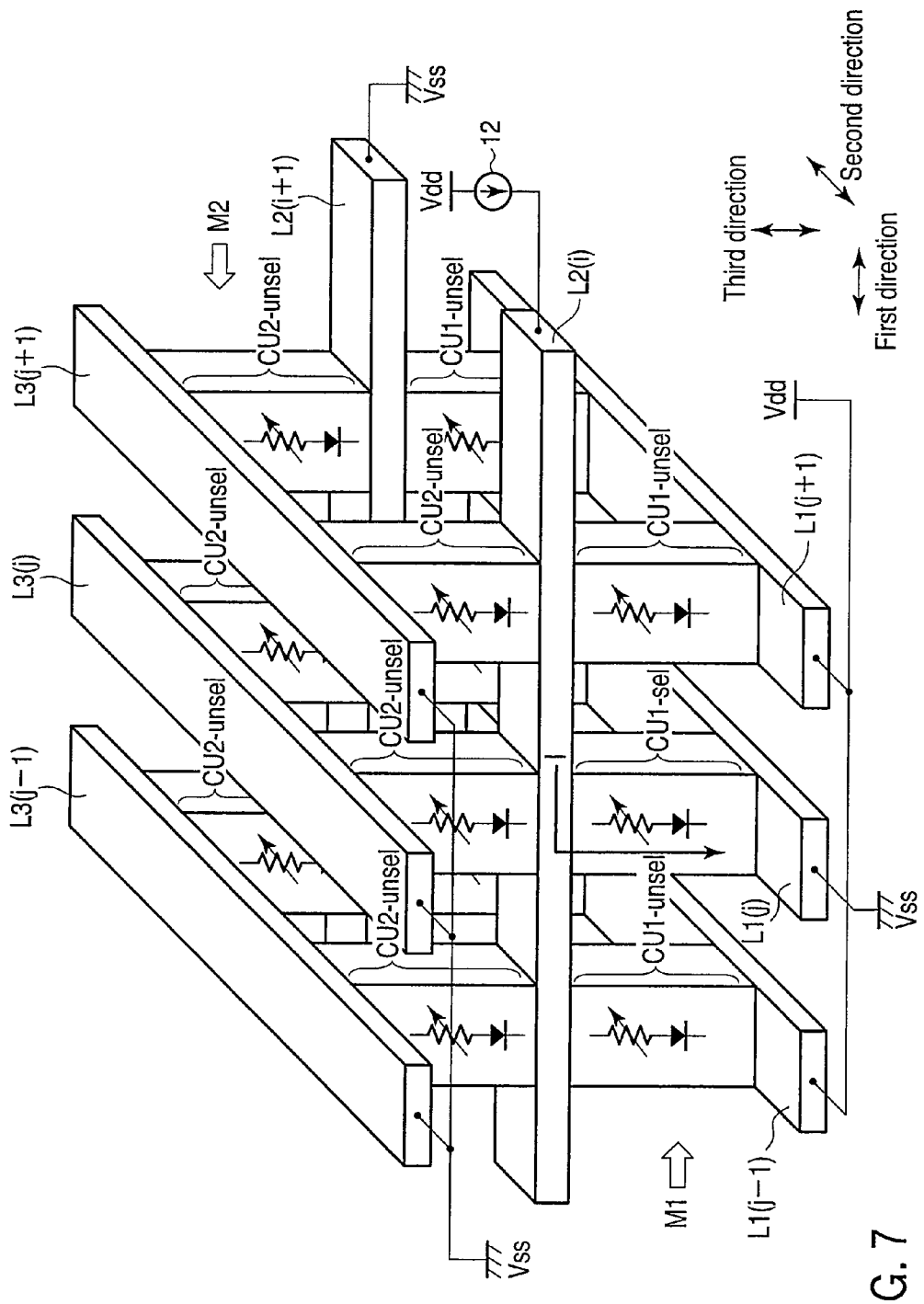
FIG. 7 is a diagram illustrating the operation of the resistance change memory.

The operation of the resistance change memory according to the present embodiment is described with FIG. 7.

FIG. 7 shows two memory cell arrays.

A memory cell array M1 corresponds to the memory cell array M1 shown in FIG. 2, and a memory cell array M2 corresponds to the memory cell array M2 shown in FIG. 2. The connection between the memory element and the nonohmic element (e.g., a rectification element) in the cell unit CU1, CU2 corresponds to a of FIG. 4.

<Set Operation>

The case where a writing (set) operation is performed on a selected cell unit CU1-sel in the memory cell array M1 is described.

The initial state of the selected cell unit CU1-sel is, for example, an erased (reset) state.

For example, the reset state is a high-resistance state (100 kΩ to 1 MΩ), and the set state is a low-resistance state (1 kΩ to 10 kΩ).

A selected interconnect line L2(i) is connected to a high-potential-side power supply potential Vdd, and a selected interconnect line L1(j) is connected to a low-potential-side power supply potential Vss (e.g., a ground potential).

Among first interconnect lines from the substrate side, unselected interconnect lines L1(j−1), L1(j+1) other than the selected interconnect line L1(j) are connected to the power supply potential Vdd. Among second interconnect lines from the substrate side, an unselected interconnect line L2(i+1) other than the selected interconnect line L2(i) is connected to the power supply potential Vss.

Furthermore, third unselected interconnect lines L3(j−1), L3(j), L3(j+1) from the substrate side are connected to the power supply potential Vss.

In this case, a forward bias is applied to the rectification element (e.g., a diode) in the selected cell unit CU1-sel. Thus, a set current I-set from a constant current source 12 runs through the selected cell unit CU1-sel, and the resistance value of the memory element in the selected cell unit CU1-sel changes from the high-resistance state to the low-resistance state.

Here, in the set operation, a voltage of, for example, about 3 V to 6 V is applied to the memory element in the selected cell unit CU1-sel during a period (pulse width) of about 10 ns to 100 ns. The value of the set current I-set passed through the memory element (high-resistance state) is, for example, about 10 nA, and the density of this current is set at a value ranging from $1\times10^5$ to $1\times10^7$ A/cm$^2$.

On the other hand, a reverse bias is applied to the rectification element (diode) in the cell unit which is connected between the unselected interconnect lines L1(j−1), L1(j+1) and the unselected interconnect line L2(i+1), among the unselected cell units CU1-unsel in the memory cell array M1. Similarly, a reverse bias is applied to the rectification element (diode) in the cell unit which is connected between the selected interconnect line L2(i) and the unselected interconnect lines L3(j−1), L3(j), L3(j+1), among unselected cell units CU2-unsel in the memory cell array M2.

In addition, the inter-terminal potential difference of the rectification element in the cell unit which is connected between the selected interconnect line L2(i) and the unselected interconnect lines L1(j−1), L1(j+1) is set at substantially zero (Vdd-Vdd). Similarly, the inter-terminal potential difference of the rectification element in the cell unit which is connected between a selected interconnect line L1(i) and the unselected interconnect line L2(i+1) is set at substantially zero (Vss-Vss).

<Reset Operation>

Next described is the case where an erasing (reset) operation is performed on the selected cell unit CU1-sel in the memory cell array M1.

A selected interconnect line L2(i) is connected to the high-potential-side power supply potential Vdd, and a selected interconnect line L1(j) is connected to the low-potential-side power supply potential Vss.

Among the first interconnect lines from the substrate side, unselected interconnect lines L1(j−1), L1(j+1) other than the selected interconnect line L1(j) are connected to the power supply potential Vdd. Among the second interconnect lines from the substrate side, an unselected interconnect line L2(i+1) other than the selected interconnect line L2(i) is connected to the power supply potential Vss.

Furthermore, the third unselected interconnect lines L3(j−1), L3(j), L3(j+1) from the substrate side are connected to the power supply potential Vss.

In this case, a forward bias is applied to the rectification element in the selected cell unit CU1-sel. Thus, a reset current I-reset from the constant current source 12 runs through the selected cell unit CU1-sel, and the resistance value of the memory element in the selected cell unit CU1-sel changes from the low-resistance state to the high-resistance state.

Here, in the reset operation, a voltage of 0.5 V to 3 V is applied to the memory element in the selected cell unit CU1-sel during a period (pulse width) of about 200 ns to 1 μs. The reset current I-reset passed through the memory element (low-resistance state) is about 1 μA to 100 μA, and the density of this current is set at a value ranging, for example, from $1\times10^3$ to $1\times10^6$ A/cm$^2$.

On the other hand, a reverse bias is applied to the rectification element in the cell unit which is connected between the unselected interconnect lines L1(j−1), L1(j+1) and the unselected interconnect line L2(i+1), among the unselected cell units CU1-unsel in the memory cell array M1. Similarly, a reverse bias is applied to the rectification element in the cell unit which is connected between the selected interconnect line L2(i) and the unselected interconnect lines L3(j−1), L3(j), L3(j+1), among the unselected cell units CU2-unsel in the memory cell array M2.

In addition, the inter-terminal potential difference of the rectification element in the cell unit which is connected between the selected interconnect line L2(i) and the unselected interconnect lines L1(j−1), L1(j+1) is set at substantially zero (Vdd-Vdd). Similarly, the inter-terminal potential difference of the rectification element in the cell unit which is connected between a selected interconnect line L1(i) and the unselected interconnect line L2(i+1) is set at substantially zero (Vss-Vss).

In addition, the value of the set current I-set and the value of the reset current I-reset are different from each other. Moreover, when the set/reset operation of the memory element depends on the pulse width of the current/voltage, the pulse width of the set current and the pulse width of the reset current are different from each other. The value or period (pulse width) of a voltage or current applied to the memory element in the selected cell unit CU1-sel depends on the materials constituting the memory element.

In the set/reset operation, a potential higher than the low-potential-side power supply potential Vss may be applied to a interconnect line connected to an unselected cell unit to charge this interconnect line in advance for the next operation in the case of a configuration that has a connection whereby a predetermined potential difference can be applied to a selected cell unit and whereby a reverse bias or potential difference of 0 V can be applied to the unselected cell unit, among the configurations of the stacked cell units shown in "a" to "p" of FIG. 4. This makes it possible to reduce the time for charging the interconnect lines in the next operation cycle and increase the operation speed of the memory.

<Read Operation>

Next described is the case where a read operation is performed on the selected cell unit CU1-sel in the memory cell array M1.

A selected interconnect line L2(i) is connected to the high-potential-side power supply potential Vdd, and a selected interconnect line L1(j) is connected to the low-potential-side power supply potential Vss.

Among the first interconnect lines from the substrate side, unselected interconnect lines L1(j−1), L1(j+1) other than the selected interconnect line L1(j) are connected to the power supply potential Vdd. Among the second interconnect lines from the substrate side, an unselected interconnect line L2(i+1) other than the selected interconnect line L2(i) is connected to the power supply potential Vss.

Furthermore, third unselected interconnect lines L3(j−1), L3(j), L3(j+1) from the substrate side are connected to the power supply potential Vss.

In this case, a forward bias is applied to the rectification element (e.g., a diode) in the selected cell unit CU1-sel. Thus, the read current I-read from the constant current source 12 runs through the memory element in the selected cell unit CU1-sel (the high-resistance state or the low-resistance state).

Therefore, for example, by detecting a potential change in a sense node when the read current I-read is running through the memory element, data (resistance value) in the memory element can be read.

Here, the value of the read current I-read needs to be much lower than the value of the set current I-set and the value of the reset current I-reset so that the resistance value of the memory element will not change in reading. When the change of the resistance value of the memory element depends on the pulse width of the current/voltage, the pulse width of the read current has to be set at a pulse width that does not change the resistance value of the memory element.

In reading, as in setting/resetting, a reverse bias is applied to the rectification element in the cell unit which is connected between the unselected interconnect lines L1(j−1), L1(j+1) and the unselected interconnect line L2(i+1), among the unselected cell units CU1-unsel in the memory cell array M1. A reverse bias is also applied to the rectification element in the cell unit which is connected between the selected interconnect line L2(i) and the unselected interconnect lines L3(j−1), L3(j), L3(j+1), among the unselected cell units CU2-unsel in the memory cell array M2.

The set/reset operation and read operation of the resistance change memory are performed as described above.

The following characteristics are required for the rectification element as the non-ohmic element: a high current (forward current) when a forward bias is applied to the rectification element, a sufficiently low current (reverse current) when a reverse bias is applied to the rectification element, and a sufficiently high breakdown voltage.

(2) Cell Unit

A basic example of the resistance change memory according to the first embodiment is described with FIG. 8 to FIG. 14.

(a) Structure

FIG. 8 shows a bird's-eye view of the basic example of the cell unit used in the resistance change memory according to the present embodiment.

In the cell unit CU shown in FIG. 8, a memory element 20 is stacked on a non-ohmic element 30. A stack composed of the memory element 20 and the non-ohmic element 30 is interposed as one cell unit CU between two interconnect lines L2(i), L3(j). Note that the structure of the cell unit CU shown in FIG. 8 is only one example, and the non-ohmic element 30 may be stacked on the memory element 20 depending on the connection in the cell unit shown in FIG. 4.

The memory element 20 is a variable resistive element or a phase change element. Here, the variable resistive element means an element made of a material having a resistance value that changes due to application of energy such as a voltage, a current or heat. The phase change element means an element made of a material having physicality (impedance) such as a resistance value or capacitance that changes with a phase change of a crystal layer caused by application of energy.

The phase change (phase transition) includes the following:

Metal-semiconductor transition, metal-insulator transition, metal-metal transition, insulator-insulator transition, insulator-semiconductor transition, insulator-metal transition, semiconductor-semiconductor transition, semiconductor-metal transition, semiconductor-insulator transition Phase change of quantum state (e.g., metal-superconductor transition)

Paramagnet-ferromagnet transition, antiferromagnet-ferromagnet transition, ferromagnet-ferromagnet transition, ferrimagnet-ferromagnet transition, or combination of the above transitions Paraelectric-ferromagnet transition, paraelectric-pyroelectric transition, paraelectric-piezoelectric transition, ferroelectric-ferroelectric transition, antiferroelectric-ferroelectric transition, or combination of the above transitions Combination of the above transitions For example, transition to a ferroelectric-ferromagnet from a metal, insulator, semiconductor, ferroelectric, paraelectric, pyroelectric, piezoelectric, ferromagnet, ferrimagnet, helimagnet, paramagnet or antiferromagnet, and reverse transition In accordance with the above definition, the variable resistive element includes the phase change element.

In the present embodiment, the memory element 20 is mainly made of, for example, a metal oxide (e.g., a binary or ternary metal oxide), a metal compound, a chalcogenide material (e.g., Ge—Sb—Te, In—Sb—Te), organic matter, carbon, or carbon nanotube.

In addition, the resistance value of a magnetoresistive effect element used for a magnetoresistive RAM (MRAM) changes when the relative directions of the magnetizations of two magnetic layers constituting this element change. In the present embodiment, a magnetoresistive effect element such as a magnetic tunnel junction (MTJ) element is also included in the variable resistive element.

As a means of changing the resistance value of the memory element 20, there are an operation called a bipolar operation and an operation called a unipolar operation.

In the bipolar operation, the polarity of a voltage applied to the memory element 20 is changed to cause a reversible change in the resistance value of the memory element 20 between at least a first value (first level) and a second value (second level). The bipolar operation requires bi-directional passage of a given intensity of current through the memory element during writing, for example, as in a spin-transfer type MRAM.

In the unipolar operation, one or both of the intensity and application time (pulse width) of a voltage is controlled without changing the polarity of the voltage applied to the memory element to cause a reversible change in the resistance value of the memory element between at least the first value and the second value.

The memory element 20 has electrode layers 25, 26 on one end and the other in the third direction (stacking direction). The electrode layer 25 is provided at the bottom of the memory element 20, and the electrode layer 26 is provided at the top of the memory element 20. The electrode layers 25, 26 are used as, for example, electrodes of the memory elements. For the electrode layer 25, 26, for example, a metal, a metal compound, and a conductive semiconductor, i.e., a stack of these materials is used.

In the present embodiment, a portion interposed between two electrode layers 25, 26 is called a resistance change film 21. The resistance change film 21 is a film made of a material having a resistance value or crystal phase that changes due to energy such as a voltage, a current or heat. The resistance change film 21 is made of a material having such a property that the film changes in its resistance value or crystal phase due to energy applied thereto. The resistance change film 21 may alternatively be made of a material having such a property that the resistance value (or crystal phase) of the memory element changes as a result of a characteristic change in the interface between the resistance change film 21 and the electrode layers 25, 26 due to energy applied thereto. In this case, the resistance value changing property of the memory element 20 may depend on the combination of the material used for the resistance change film 21 and the material used for the electrode layers 25, 26.

The resistance change film 21 may be made of a material containing impurity atoms that form a defect level, or a material containing semiconductor/metal dots (quantum dots).

The electrode layers 25, 26 may use as diffusion preventing layers. The diffusion preventing layer prevents impurities derived from the lower element 30 and derived from the interconnect line L2(i) from diffusing into the memory element 20, or prevents impurities derived from the memory element 20 from diffusing into the lower element 30 and the interconnect line L2(i). The electrode layers 25, 26 may also function as adhesive layers for preventing the memory element 20 from being detached from the lower element 30 and the interconnect line L2(i).

The non-ohmic element 30 is an element having no linearity (ohmic property) in its input/output characteristics (voltage-current characteristics).

The non-ohmic element 30 has conductive layers 38, 39 on one end and the other. The non-ohmic element 30 has a stack structure composed of a plurality of layers provided between the two conductive layers 38, 39. Depending on the configuration of the cell unit or the operating characteristics required for the resistance change memory, the non-ohmic element 30 has one of the stack structures composed of a plurality of layers shown in FIG. 9A to FIG. 9C.

In the structure example shown in FIG. 9A, the non-ohmic element 30 includes two layers (films) 31, 33 sandwiched between two conductive layers (electrodes) 38, 39. The first layer 31 and the second layer 33 form a junction necessary for their output characteristics to exhibit the non-ohmic property.

A non-ohmic element having such a two-layer structure may be, for example, a pn diode or a Schottky diode.

The pn diode is a diode in which a p-type semiconductor layer (anode layer) and an n-type semiconductor layer (cathode layer) form a pn junction. In this case, one of the two layers 31, 33 is the p-type semiconductor layer, and the other layer is the n-type semiconductor layer.

The Schottky diode is a diode in which a semiconductor layer and a metal layer form a Schottky junction. In this case, one of the two layers 31, 32 is the semiconductor layer, and the other layer is the metal layer.

In the structure example shown in FIG. 9B, the stack structure of the non-ohmic element 30 sandwiched between two conductive layers 38, 39 includes three layers (films) 31, 32, 33. The second layer 32 is sandwiched between the first layer 31 and the third layer 33. The three layers 31, 32, 33 form a junction necessary for their output characteristics to exhibit the non-ohmic property.

A non-ohmic element 30 having such a three-layer structure may be, for example, a pin diode or a metal-insulator-semiconductor (MIS) diode.

The pin diode is a diode having an intrinsic semiconductor layer between a p-type semiconductor layer (anode layer) and an n-type semiconductor layer (cathode layer). In this case, the layer 32 sandwiched between the two layers 31, 33 is the intrinsic semiconductor layer. One of the two layers 31, 33 is the p-type semiconductor layer, and the other layer is the n-type semiconductor layer. The intrinsic semiconductor layer may not only contain no n-type or p-type impurity but may also have a low impurity concentration that is negligible in terms of intrinsic carrier density or have an impurity concentration lower than that of the n-type and p-type semiconductor layers.

The MIS diode is a diode having an insulating layer between a metal layer and a semiconductor layer. In this case, the layer 32 sandwiched between the two layers 31, 33 is the insulating layer. One of the two layers 31, 33 is the semiconductor layer, and the other layer is the metal layer.

Examples of the structure of the non-ohmic element having a three-layer structure other than the diode include a semiconductor-insulator-semiconductor (SIS) structure and a metal-insulator-metal (MIM) structure. In the MIM structure or SIS structure, both of the two layers 31, 33 are the metal layers or semiconductor layers, and the layer 32 sandwiched between the two layers 31, 33 is the insulating layer.

Another example of the non-ohmic element having the three-layer structure is a bipolar transistor type structure in which the semiconductor layer 32 of a different conductivity type is sandwiched between the two semiconductor layers 31, 33 of the same conductivity type.

In the structure example shown in FIG. 9C, the non-ohmic element 30 includes four layers 31, 32, 34, 33. The four layers 31, 32, 34, 33 form a junction necessary for their output characteristics to exhibit the non-ohmic property.

A non-ohmic element 30 having such a four-layer structure as in FIG. 9C may be a semiconductor-metal-insulator-semiconductor (SMIS) diode. The SMIS diode has a structure in which a semiconductor layer is added to a MIS diode, and includes a metal layer and an insulating layer that are sandwiched between the two semiconductor layers 31, 33. One of the two layers 32, 34 sandwiched between the two semiconductor layers 31, 33 is the metal layer, and the other layer is the insulating layer.

Another example of the non-ohmic element having the four-layer structure is a thyristor type structure. The thyristor type structure has alternately stacked P-type and N-type semiconductor layers.

It is preferable that in a resistance change memory driven by the unipolar operation, the forward bias characteristics of the non-ohmic element are greatly different from the reverse bias characteristics of the non-ohmic element. Thus, in the unipolar type resistance change memory, a rectification element such as a diode is mainly used as the non-ohmic element 30.

It is preferable that in a resistance change memory driven by the bipolar operation, the forward bias characteristics and reverse bias characteristics of the non-ohmic element are approximately line-symmetrical with respect to the current axis of I-V characteristics. Thus, in the bipolar type resistance change memory, the MIM structure or SIS structure, or the bipolar transistor type structure is used as the non-ohmic element 30.

The above-mentioned bipolar transistor type structure and thyristor type structure only show the stacking order of the P-type and N-type semiconductor layers, and do not limit the thickness of the semiconductor layers, the impurity concentration and the element operation.

In the resistance change memory according to the present embodiment, at least one of the two conductive layers 38, 39 included in the non-ohmic element 30 is a silicide layer. In the case described here, the conductive layer 39 provided in the upper part (memory element 20 side) of the non-ohmic element 30 is the silicide layer 39. The conductive layer 39 will hereinafter be referred to as the silicide layer 39.

In the non-ohmic element 30 according to the present embodiment, the semiconductor layer 33 is provided adjacently to the silicide layer 39. The semiconductor layer 33 is, for example, a layer containing silicon as the main component. In the non-ohmic element 30 shown in FIG. 8, the silicide layer 39 is provided on the semiconductor layer 33.

The semiconductor layer 33 is made of, for example, silicon (Si), silicon germanium (SiGe), silicon tin (SiSn) or silicon carbide (SiC). When SiGe is used for the semiconductor layer, the concentration (atm %) of Ge included in SiGe is, for example, about 0 to 30 atm %. When SiSn is used for the semiconductor layer, the concentration of Sn is, for example, about 0 to 5 atm %. When SiC is used for the semiconductor layer, the concentration of C is, for example, about 0 to 5 atm %. For ease of explanation, the Si-containing semiconductor layer 33 adjacent to the silicide layer 39 will hereinafter be simply referred to as a silicon layer.

The silicide layer 39 is formed by a chemical reaction between a metal and the silicon layer 33 caused by heating (referred to as a silicide reaction).

In FIG. 8, the silicon layer 33 has a plurality of regions 33a, 33b, 33c therein. The regions 33a, 33c are semiconductor regions, and here, are regions (silicon regions) containing silicon as the main component.

In the resistance change memory according to the present embodiment, the region 33b within the silicon layer 33 is a region containing silicon, similarly to the region 33a and the region 33c. However, the crystal structure of the region 33b is different from the crystal structures of the region 33a and the region 33c. Therefore, the continuity of the crystal structure between the region 33a and the region 33c is divided by the region 33b.

When the crystal structure between the two regions 33a, 33c is discontinuous, the diffusion (movement) of metal atoms from the region 33a to the region 33c during the formation of the silicide layer is prevented by the region 33b having a different crystal structure.

This inhibits the deterioration of the characteristics of the non-ohmic element 30 caused by the diffusion of the metal atoms.

Hereinafter, the pin diode is taken as an example of the non-ohmic element 30 used in the resistance change memory according to the present embodiment to more specifically describe the configuration of the non-ohmic element 30 according to the present embodiment with reference to FIG. 10A to FIG. 14.

In the cell unit CU1 shown in FIG. 10A, a pin diode 30 as a non-ohmic element has a stack structure composed of an n-type semiconductor layer 31 (hereinafter referred to as an n-type layer 31), an intrinsic semiconductor layer (hereinafter referred to as an i-type layer 32) and a p-type semiconductor layer (hereinafter referred to as a p-type layer 33).

The n-type layer 31 is provided on the conductive layer 38. The i-type layer 32 is provided on the n-type layer 31, and the p-type layer 33 is provided on the i-type layer 32.

The conductive layer 38 is provided on the bottom (substrate side) of the n-type layer 31, and the conductive layer 39 is provided on the top of the p-type layer 33.

The n-type layer 31 is, for example, a silicon layer containing a donor impurity (e.g., arsenic or phosphorus). In this case, the impurity concentration of the n-type layer 31 is $10^{20}/cm^3$ or more and $10^{23}/cm^3$ or less. The p-type layer 33 is, for example, a silicon layer containing an acceptor impurity (e.g., boron). In this case, the impurity concentration of the p-type layer 33 is $10^{20}/cm^3$ or more and $10^{23}/cm^3$ or less. The i-type layer 32 is an intrinsic silicon layer. However, instead of the i-type layer 32, an n-type silicon layer having an impurity concentration of $10^{19}/cm^3$ or less may be used as a component of the pin diode.

The thickness of the n-type layer 31 and the p-type layer 33 is, for example, 3 nm or more and 15 nm or less. The thickness of the i-type layer 32 is, for example, 60 nm or more and 100 nm or less.

For example, titanium nitride (TiN) is used for the conductive layer 38. The conductive layer 39 is a silicide layer. For example, titanium silicide ($TiSi_x$) or platinum silicide ($PtSi_x$), tungsten silicide ($WSi_x$) tantalum silicide ($TaSi_x$) platinum nickel silicide ($Ni_{1-y}PT_ySi_x$) (x>0 1>y>0) is used for the silicide layer 39.

In the example shown in FIG. 10A, the p-type layer 33 has three regions 33a, 33b, 33c therein.

The region 33a is provided on the bottom side (substrate side) of the p-type layer 33. The region 33c is provided on the top side (memory element side) of the p-type layer 33. Moreover, the region 33b is provided between the region 33a and the region 33c. Regarding these three regions 33a, 33b, 33c, the region 33b is different in crystal structure from the other regions 33a, 33c. In other words, the three regions 33a, 33b, 33c are regions containing silicon as the main component, while the region 33b is made of a silicon compound different from the material of the other two regions 33a, 33c.

For example, the region 33b is formed by a crystalline region made of at least one of a silicon oxide, silicon nitride, silicon oxynitride and silicon carbide. Alternatively, the region 33b may be an amorphous region made of amorphous silicon or amorphous silicon oxide. When the region 33b is made of amorphous silicon, the region 33b may contain hydrogen. However, the region 33b may contain two or more kinds of compounds.

The thickness (dimension along the third direction) of the region 33b is smaller than the thickness of the regions 33a, 33c. For example, the thickness of the region 33b ranges from 1 nm to a level of several atomic layers.

The region 33b is different in crystal structure from the regions 33a, 33c, so that crystal alignment between the two regions 33a, 33c is divided, and the crystal structures of the two regions 33a, 33c are discontinuous.

Figure 11:
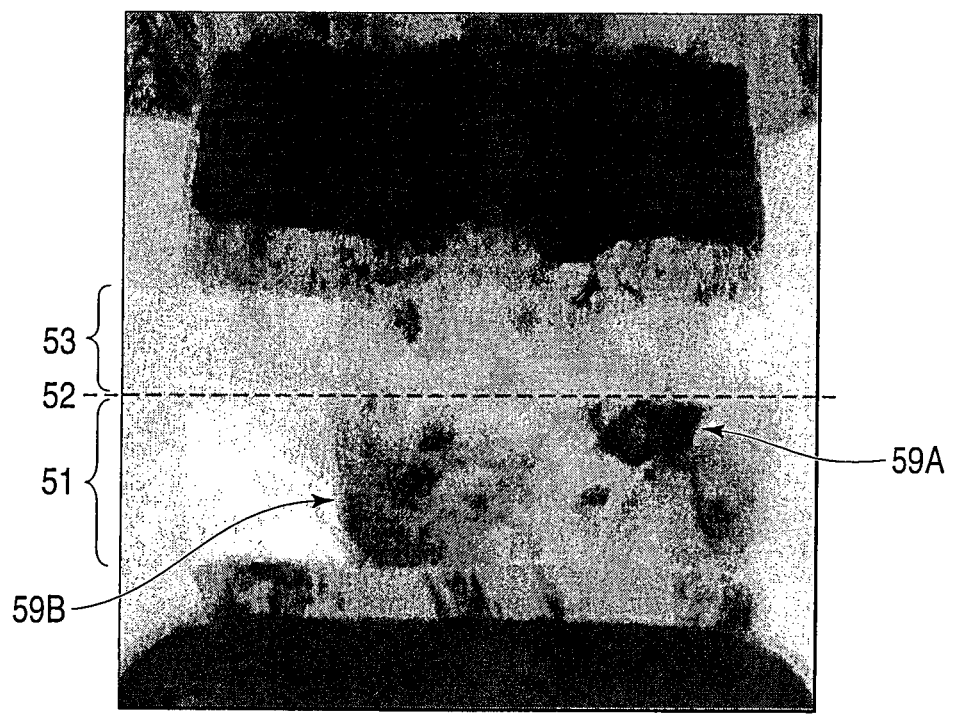
FIG. 11 is a view for illustrating the configuration of the non-ohmic element according to the embodiment.

FIG. 11 is an image showing the discontinuity of crystal attributed to the region intervening between two regions. FIG. 11 schematically shows an electron-microscopic image of the semiconductor layer that includes a region 52 different in crystal structure from other regions 51, 53.

In the example shown in FIG. 11, the region 52 is provided between the two regions 51, 53. However, as the thickness of the region 52 is extremely small (1 nm or less) as described above, the region 52 is not shown (observed) in FIG. 11.

The region 52 is formed by, for example, the enclosure of an $N_2O$ gas during the formation of the silicon regions 51, 53. Thus, in FIG. 11, the region 52 is formed by at least one of a silicon oxide film, silicon nitride film and silicon oxynitride film. However, the region 52 may not react with oxygen or nitrogen and remains as amorphous silicon or a crystal grain boundary.

In FIG. 11, the region 51 is an n-type silicon region, and the region 53 is a p-type silicon region. A donor impurity or acceptor impurity in the regions 51, 53 is added by ion implantation after the formation of the regions 51, 52, 53.

As shown in FIG. 11, crystal grains 59A, 59B formed in the n-type silicon region 51 are separated by the region 52, and the crystal grains 59A, 59B do not extend over the p-type silicon region 53 higher than the region 52.

Thus, the region 52 is provided between the two regions 51, 53, so that the crystal structure (crystal grain) between the n-type silicon region 51 and the p-type silicon region 53 is made discontinuous by the region 52.

The region 33b is provided in the semiconductor layer (here, silicon layer) as in the non-ohmic element (pin diode) 30 of the cell unit shown in FIG. 10A, so that the movement of atoms between the two regions 33a, 33c sandwiching the region 33b is prevented. For example, when the silicide layer 39 is formed, metal atoms for forming the silicide layer do not easily diffuse into the silicon region 33a under the region 33b. The region 33b which intervenes between the two regions 33a, 33c and which inhibits the diffusion of the atoms is referred to as a diffusion buffering region 33b in the present embodiment. As described above, the diffusion buffering region 33b is different in crystal structure from the other regions 33a, 33c adjacent thereto. The diffusion buffering region 33b divides the crystal alignment between the two regions 33a, 33c. Therefore, the diffusion buffering region can otherwise be referred to as a crystal dividing region.

Furthermore, as shown in FIG. 10B, the silicide layer (conductive layer) 39 may be integrated with the electrode layer 25 for the memory element 20, and the memory element 20 and the non-ohmic element (pin diode) 30 may be connected in series via a silicide layer (conductive layer) 39-1. In this case, the silicide layer 39-1 is in contact with the resistance change film 21.

Figure 12:
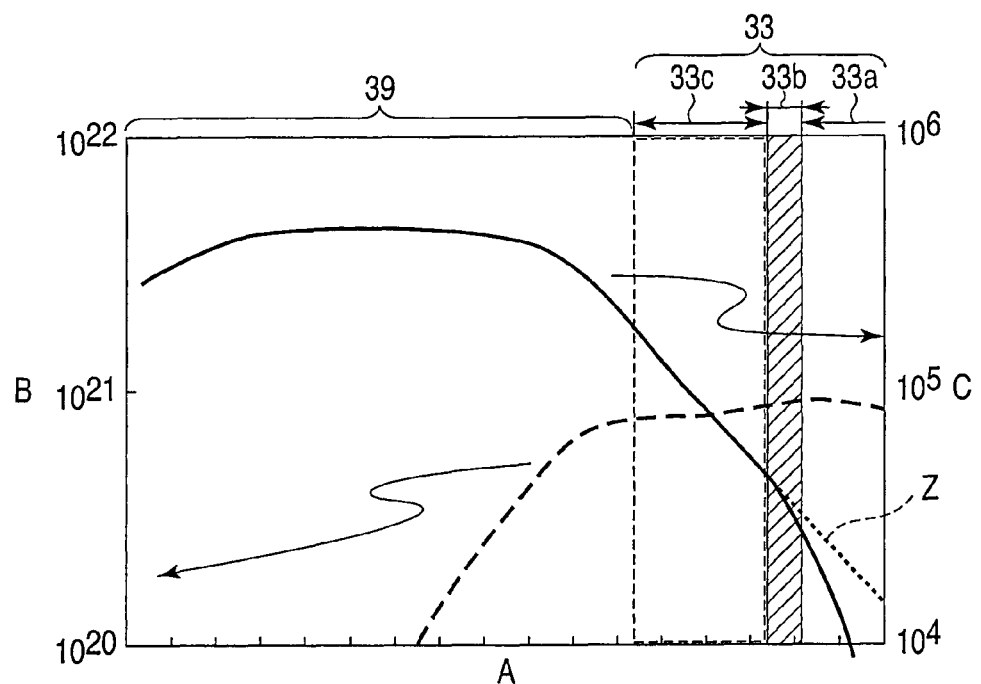
FIG. 12 is a graph for illustrating the advantage of the non-ohmic element according to the embodiment.

FIG. 12 shows the concentration profile of constituent atoms in the stack structure of the silicide layer 39 and the silicon layer 33. In the example shown in FIG. 12, the silicide layer 39 is made of $TiSi_x$ (however, x>0). The diffusion buffering region 33b is a region formed by the enclosure of an $N_2O$ gas during the deposition of the silicon regions 33a, 33c.

The horizontal axis A in FIG. 12 indicates the dimensions of the silicide layer 39 and the silicon layer 33 in a depth direction (stacking direction). In FIG. 12, the vertical axis B side corresponds to the top side of the silicide layer 39, and the vertical axis C side corresponds to the bottom side of the silicon layer 33.

The vertical axis B of FIG. 12 indicates, on a logarithmic scale, the concentration (unit: number/$cm^3$) of silicon atoms contained in each of the layers 33, 39. In FIG. 12, the concentration profile of silicon atoms is indicated by a broken line.

The vertical axis C of FIG. 12 indicates, on a logarithmic scale, the concentration (unit: number/$cm^3$) of Ti atoms contained in each of the layers 33, 39. The concentration profile of Ti atoms is indicated by a full line.

In FIG. 12, the concentration of Ti atoms shows a value of about $2 \times 10^{21}$ to $3 \times 10^{21}$/$cm^3$ in the vicinity of the interface between the silicide layer 39 and the silicon region 33c. The silicide layer 39 is formed by a silicide reaction between Ti and silicon, and Ti atoms are therefore diffused into the silicon layer 39 by a heat treatment (silicide treatment). In the silicon layer 39, the concentration of Ti atoms decreases from the upper (silicide layer 39 side) silicon region 33c toward the lower silicon region 33a.

In FIG. 12, a dotted line Z indicates the extension of the inclination of the concentration profile of Ti atoms in the silicon region 33c.

As shown in FIG. 12, the negative inclination of the concentration profile of Ti atoms in the diffusion buffering region 33b and the silicon region 33c is greater (steeper) than the negative inclination indicated by the dotted line Z. This shows that the diffusion of Ti atoms in the diffusion buffering region 33b and the region 33a thereunder is less than the diffusion of Ti atoms in the silicon region 33c.

The negative inclination of the concentration profile increases starting from the diffusion buffering region 33b. That is, the diffusion of Ti atoms (metal atoms) is inhibited by the provision of the diffusion buffering region 33b in the silicon layer 33.

Figure 13A:
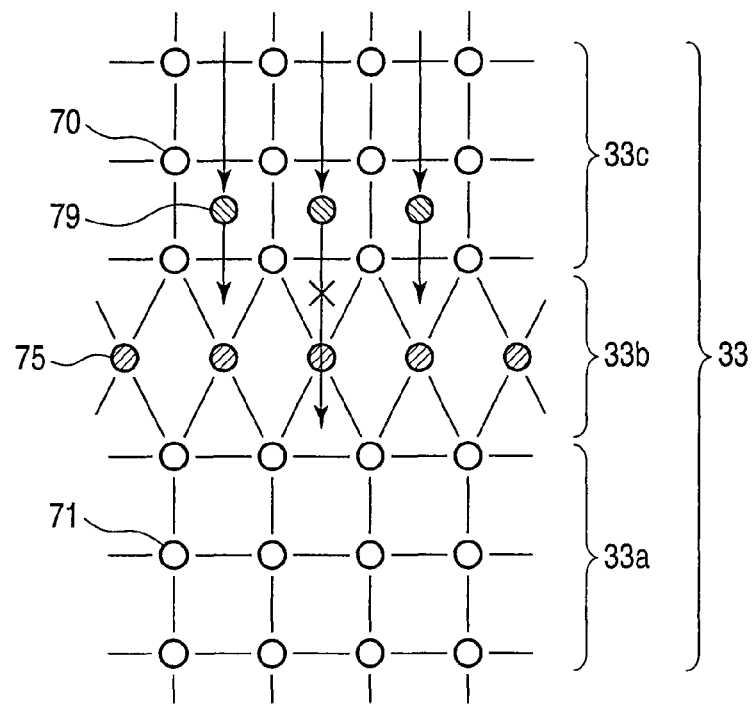
FIG. 13A is a diagram for illustrating the principle of the non-ohmic element according to the embodiment.

The reason that the diffusion buffering region 33b inhibits the diffusion of metal atoms from one region 33a to the other region 33c between which the region 33b intervenes is described with FIG. 13A and FIG. 13B.

FIG. 13A and FIG. 13B are diagrams schematically showing the atomic arrangement (crystal structure) of the semiconductor layer 33. Although the atoms in each of the regions 33a, 33b, 33c are two-dimensionally arranged in the examples shown in FIG. 13A and FIG. 13B, it goes without saying that the actual atoms in each of the regions 33a, 33b, 33c are three-dimensionally arranged.

In the case illustrated in FIG. 13A, the diffusion buffering region 33b has a given crystal structure in the semiconductor layer 33. The kind of crystal structure of the diffusion buffering region 33b is not limited as long as the crystal structure of the diffusion buffering region 33b is different from the crystal structures of the regions 33a, 33c.

The two regions 33a, 33c in the semiconductor layer are formed by atoms 70, 71, respectively. The atoms 70, 71 are, for example, silicon atoms.

The diffusion buffering region 33b is formed by an atom 75 and the silicon atoms 70, 71. The atom 75 is chemically combined with the silicon atoms 70, 71. The atom 75 is different from the silicon atoms 70, 71. For example, the atom 75 is an oxygen atom, nitrogen atom or carbon atom. Thus, although the atom 75 is combined with the silicon atoms 70, 71, the crystal structure of the diffusion buffering region 33b is different from the crystal structures of the silicon regions 33a, 33c.

During the silicide treatment, metal atoms 79 for forming the silicide layer move in the semiconductor layer 33. Here, the metal atoms 79 diffuse from the side of the region 33c to the side of the region 33a.

As shown in FIG. 13A, when the diffusion buffering region 33b different in crystal structure from silicon intervenes between the two silicon regions 33a, 33c, the diffusion buffering region 33b is different from the silicon regions 33a, 33c in the atomic arrangement, interatomic distance (lattice constant) and crystal alignment. This prevents the movement of the metal atoms 79 from the silicon region 33c to the silicon region 33a.

Therefore, the metal atoms 79 cause a silicide reaction with the silicon atoms 70 in the region 33c or are segregated in the vicinity of the interface (crystal grain boundary) between the region 33c and the diffusion buffering region 33b.

Thus, the number of the metal atoms 79 diffused in the region 33a under the diffusion buffering region 33b is smaller than the number of the metal atoms 79 diffused in the region 33c above the diffusion buffering region 33b.

In the case illustrated in FIG. 13B, the diffusion buffering region 33b is an amorphous region. Here, when atoms constituting the regions 33a, 33c are silicon, the amorphous diffusion buffering region 33b is made of amorphous silicon, or amorphous silicon oxide or nitride. However, if the diffusion buffering region 33b is an amorphous region, the kind of atoms constituting the diffusion buffering region 33b is not limited.

In the diffusion buffering region 33b, its constituent atoms (e.g., silicon atoms) 75 are randomly arranged. As the atomic arrangement in the diffusion buffering region 33b is random, the metal atoms 79 do not easily move in the diffusion buffering region 33b. As a result, the diffusion of the metal atoms 79 in the semiconductor layer 33 is inhibited, as in the example shown in FIG. 13A.

As shown in FIG. 13A and FIG. 13B, the diffusion buffering region 33b is provided in the semiconductor layer 33. Thus, the atoms in the semiconductor layer are irregularly arranged, or regions where the atoms are densely arranged are formed in the semiconductor layer. Consequently, the metal atoms do not easily move in the diffusion buffering region 33b, and the movement of the metal atoms 79 between the two regions 33a, 33c via the diffusion buffering region 33b is reduced.

In addition, the atomic arrangement of the diffusion buffering region 33b is preferably denser than the atomic arrangement of the regions 33a, 33c in the semiconductor layer 33 except for the diffusion buffering region 33b. Alternatively, when the diffusion buffering region 33b is a crystal layer, the lattice constant of the material forming the diffusion buffering region 33b is preferably lower than the lattice constant of the material forming the two regions 33a, 33c that sandwich the diffusion buffering region 33b.

The diffusion buffering region 33b provided in the semiconductor layer 33 not only inhibits the thermal diffusion of the metal atoms for forming the silicide layer but also inhibits the diffusion of the donor/acceptor impurity contained in the semiconductor layer.

FIG. 14 shows the concentration profile of the impurity contained in the semiconductor layer.

The horizontal axis D in FIG. 14 indicates the dimension of the silicon layer in the depth direction (stacking direction). The vertical axis E of FIG. 14 indicates, on a logarithmic scale, the concentration (unit: number/cm$^3$) of boron atoms contained in the silicon layer. In FIG. 14, the concentration profile of boron in the silicon layer including the diffusion buffering region 33b is indicated by a full line, and the concentration profile of boron in the silicon layer including no diffusion buffering region is indicated by a broken line.

In FIG. 14, the semiconductor layer is a silicon layer, and the impurity added thereto is boron. For example, SiC is used for the diffusion buffering region 33b. The diffusion buffering region 33b is provided between the silicon region 33a and the silicon region 33c.

As shown in FIG. 14, the concentration profile of boron varies starting from the part corresponding to the diffusion buffering region 33b depending on whether the silicon layer includes the diffusion buffering region (SiC) 33b.

In the region 33c adjacent to the diffusion buffering region 33b, the concentration of boron in the silicon layer including the diffusion buffering region 33b is lower than the concentration of boron in the silicon layer without diffusion buffering region 33b. That is, the diffusion buffering region 33b inhibits the diffusion of boron into the region 33c.

Thus, when the diffusion buffering region 33b is provided in the semiconductor layer, not only the diffusion of the metal atoms but also the diffusion of the donor/acceptor impurity can be inhibited. For example, the diffusion of As, P, In can be also inhibited.

In addition, the diffusion buffering region 33b preferably has a uniform thickness in every part between the two regions 33a, 33c. However, even if the diffusion buffering region 33b is not uniform in thickness and is distributed in an island shape between the two regions 33a, 33c, the diffusion buffering region 33b may be able to have the effect of inhibiting the diffusion of the metal atoms and the donor/acceptor impurity.

As described above, in the non-ohmic element used in the resistance change memory according to the present embodiment, the diffusion buffering region 33b is provided in the semiconductor layer 33 adjacent to the conductive layer (e.g., a silicide layer). The diffusion buffering region 33b is different in crystal structure from the other regions 33a, 33c in the semiconductor layer 33. Thus, as has been described with FIG. 10 to FIG. 14, the metal atoms are inhibited from diffusing into the region 33a except for the part between the diffusion buffering region 33b and the conductive layer (silicide layer) 39 during an annealing for forming the silicide or activation of impurities.

This inhibits an impurity level derived from the diffused metal atoms from being formed in the semiconductor layer 33a and the layer 32 thereunder. Moreover, agglomeration of the silicide in the semiconductor layer 33a adjacent to the silicide layer and in the layer 32 thereunder is also inhibited.

The formation of the impurity level in the semiconductor layers 32, 33a is thus inhibited. Consequently, the characteristic deterioration of the non-ohmic element can be reduced. For example, a leak current via the impurity level in the non-ohmic element can be reduced when a reverse bias is applied because of provided the diffusion buffering region 33b.

For example, in the non-ohmic element such as a pin diode including the intrinsic semiconductor layer (i-type layer), the intrinsic semiconductor layer is easily influenced by the impurity. Therefore, the diffusion buffering region is provided between the metal layer or silicide layer and the intrinsic semiconductor layer so that the diffusion of the impurity (metal atoms) into the intrinsic semiconductor layer can be inhibited, which is effective in inhibiting the quality change and deterioration of the intrinsic semiconductor layer. As a result, characteristic deterioration of the non-ohmic element having the i-type layer as a component can be inhibited.

The process of manufacturing the resistance change memory may include a step carried out at a temperature of about 600° C. to 800° C. The metal atoms more easily diffuse and agglomerate at a higher temperature. Therefore, when the manufacturing step carried out at a high temperature is included, providing the diffusion buffering region 33b in the semiconductor layer 33 to inhibit the diffusion is effective.

Agglomeration in the semiconductor layer probabilistically randomly occurs due to in-plane uniformity and shape variations attributed to uncertain factors in each process. Therefore, when agglomeration occurs in the cell unit, characteristic variation of the non-ohmic elements included in the memory cell array is greater. However, in the resistance change memory according to the present embodiment, the non-ohmic element including the diffusion buffering region 33b is used. This makes it possible to inhibit the agglomeration depending on the position of the diffusion buffering region 33b and the diffusion of the metal promoted by the agglomeration and reduce the variation of element characteristics.

Furthermore, when agglomeration occurs in the semiconductor layer 33, the size of the agglomerated metal atoms (including silicide) may surpass the thickness of the semiconductor layer 33 in a direction perpendicular to the surface of the substrate. As a result, the agglomerated metal atoms (or silicide) break through the semiconductor layer 33, and the silicide layer (conductive layer) 39 and the semiconductor layer 32 are short-circuited by the agglomerated metal atoms. That is, the p-type or n-type semiconductor layer 33 does not function any more, and the function of the non-ohmic element 30 is lost. Or, a forward current is small because of increasing a interface resistance between the semiconductor layer and the silicide layer to connect the silicide layer (conductive layer) 39 and the layer 32 (the intrinsic layer). However, the non-ohmic element including the diffusion buffering region 33b is used in the resistance change memory according to the present embodiment. This makes it possible to prevent the metal atoms that cause agglomeration from diffusing into the semiconductor layer 33. As a result of a short circuit between the silicide layer (conductive layer) 39 and the semiconductor layer 32 is prevented.

When the silicide layer is used as the electrode layer of the non-ohmic element 30, interface resistance is generated between the semiconductor layer and the silicide layer due to the height of their Schottky barrier. If this interface resistance is high, the upper limit value of the forward current of the non-ohmic element when a forward bias is applied is low.

In order to reduce the interface resistance, the height of the Schottky barrier between the semiconductor layer and the silicide layer used in the non-ohmic element is preferably reduced. That is, in order to reduce the height of the Schottky barrier for the semiconductor layer, a silicide layer having a Fermi level (work function) suitable for the semiconductor layer is selected. However, there are materials that easily cause the diffusion and agglomeration of the metal atoms depending on the kind of metal atom for forming the silicide layer.

When the diffusion buffering region 33b is provided in the semiconductor layer 33 as described above, the metal atoms for forming the silicide layer can be inhibited from diffusing into the semiconductor layer during the silicide treatment.

Thus, a metal for forming the silicide layer can be selected without taking into consideration the diffusion and agglomeration of the metal atoms, and a silicide layer having a Fermi level (work function) suitable for the semiconductor layer of the non-ohmic element can be formed on the semiconductor layer. Therefore, when the semiconductor layer including the diffusion buffering region is used in the non-ohmic element, the interface resistance between the semiconductor layer and the conductive layer as the electrode can be reduced.

A phenomenon called Fermi level pinning may occur at the junction of the conductive layer and the semiconductor. The Fermi level pinning is a phenomenon in which the Fermi level of the semiconductor is fixed as a result of metal induced gap states (MIGS) which are generated due to the seepage of the wave motion (wave function) of electrons of a conductor into the side of the semiconductor.

Due to this Fermi level pinning, a high Schottky barrier is formed between the silicide layer and the semiconductor layer, and the interface resistance may increase.

When the diffusion buffering region 33b provided in the semiconductor layer 33 is made of an insulator as in the resistance change memory according to the present embodiment, the seepage of the wave function from the conductive layer (silicide layer) into the semiconductor layer may be inhibited by the intervention of the insulator. In this case, the Fermi level pinning in the semiconductor layer may be eased. As a result, generation of the Schottky barrier due to the Fermi level pinning may be inhibited, and the interface resistance between the conductive layer and the semiconductor layer may be reduced.

Furthermore, when the insulator serving as the diffusion buffering region 33b has an extremely small thickness ranging from 1 nm or less to a level of several atomic layers, the forward current of the non-ohmic element is hardly decreased by the diffusion buffering region 33b made of an insulator.

Therefore, when the diffusion buffering region 33b is made of an insulator, characteristic deterioration of the non-ohmic element can be reduced in the resistance change memory according to the present embodiment.

Furthermore, as has been shown in FIG. 14, the diffusion buffering region 33b formed in the semiconductor layer 33 can also inhibit the diffusion of the donor/acceptor impurity added to the semiconductor layer 33. Thus, when the diffusion buffering region 33b is formed between the metal layer or silicide layer and the intrinsic semiconductor layer, element characteristic deterioration due to the diffusion of the donor/acceptor impurity can also be reduced.

Moreover, in the resistance change memory according to the present embodiment, the semiconductor layer 33 adjacent to the silicide layer (or layer containing metal atoms) 39 does not have to be increased in thickness to ease the diffusion of the metal atoms into the intrinsic semiconductor layer 32 and the agglomeration of the metal atoms. That is, the semiconductor layer 33 can be reduced in thickness, and the cell unit can be reduced in thickness. As a result, in the resistance change memory according to the present embodiment, the storage density of the memory cell array can be improved without increasing the aspect ratio of the cell unit.

When the non-ohmic element is a pin diode, the thickness of the semiconductor layer (p-type layer) 33 is reduced, and the thickness of the intrinsic semiconductor layer (i-type layer) 32 under the layer 33 can be increased accordingly. Thus, when a reverse bias is being applied, an electric field within the pin diode can be relaxed as a result of the increase in the thickness of the i-type layer, and a reverse current in the pin diode can be reduced. This is effective in reducing power consumption, improving the operation speed and improving read operation.

Although the non-ohmic element including the silicon layer and the silicide layer has been shown by way of example in the present embodiment, it goes without saying that similar advantages can also be brought about when a conductive layer other than the silicide layer is used or when other compound semiconductors described later are used.

For the bipolar type memory element, the metal elements may be diffused to the buffering region to form the impurity level there by making the first semiconductor layer ultrathin, when the bipolar operation executes in a state that the diode is applied to the reverse bias. In this case, a large current having a level that the off-leakage current is not overlarge can flow, when the high voltage over −4V is applied. In addition, the memory operation for reducing the off-leakage current may execute by controlling the diffusion of impurities, when the on-voltage of the diode that is applied to the reverse bias becomes large by using a generation of carriers using the insulating film.

As described above, in the resistance change memory according to the present embodiment, characteristic deterioration of the non-ohmic element in the resistance change memory can be inhibited.

(3) Manufacturing Method

A method of manufacturing the resistance change memory according to the present embodiment is described with FIG. 15A to FIG. 16B. In the example of the structure of a cell unit formed in the present manufacturing method, a memory element is stacked on a non-ohmic element. However, it goes without saying that the present manufacturing method is also applicable to a structure in which a non-ohmic element is stacked on a memory element.

Figure 15A:
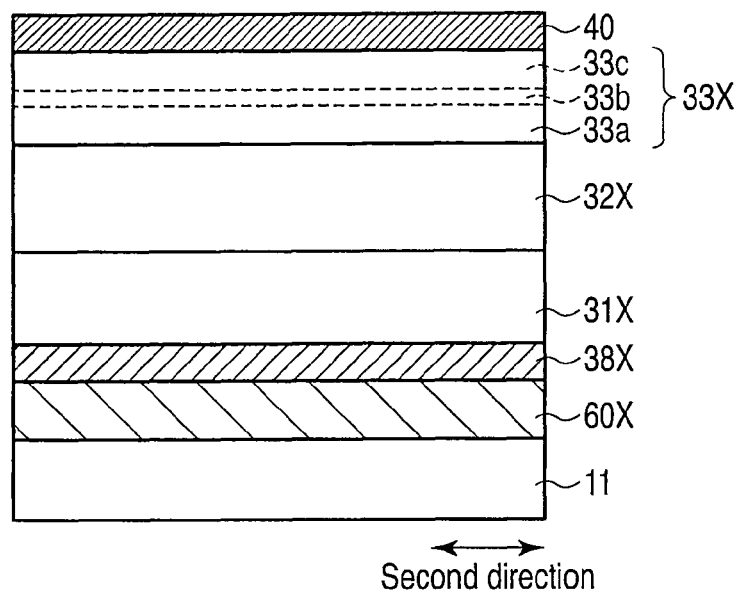
FIG. 15A is a diagram showing one step of a method of manufacturing the resistance change memory according to the embodiment.

FIG. 15A shows the sectional structure of a memory cell array along a second direction in one step of the method of manufacturing the resistance change memory according to the present embodiment.

As shown in FIG. 15A, a interconnect layer 60X serving as a interconnect line of the memory cell array is deposited on a substrate (e.g., an interlayer insulating film) 11 by, for example, a chemical vapor deposition (CVD) method or a sputter method.

A plurality of layers for forming a non-ohmic element of the cell unit are sequentially deposited on the interconnect layer 60X by, for example, the chemical vapor deposition (CVD) method or the sputter method. In the case described in connection with the manufacturing method according to the present embodiment, a pin diode is formed as the non-ohmic element.

A conductive layer 38X as an electrode of the non-ohmic element is formed on the interconnect layer 60X. The conductive layer 38X is made of, for example, TiN.

A semiconductor layer 31X is deposited on the conductive layer 38X. The semiconductor layer 31X is, for example, an n-type Si layer (hereinafter referred to as an n-type layer). A semiconductor layer 32X is deposited on the n-type layer 31X. The semiconductor layer 32X is, for example, an intrinsic Si layer (hereinafter referred to as an i-type layer). In addition, a thin natural oxide film may be formed between the conductive layer 38X and the semiconductor layer 31X. In this case, metal atoms do not easily diffuse into the semiconductor layer 31X from the conductive layer 38X, and there is thus no need to form a diffusion preventing layer in the semiconductor layer 31X. As a result, the process of manufacturing the resistance change memory according to the present embodiment can be simplified.

A semiconductor layer 33X is deposited on the semiconductor layer 32X. The semiconductor layer 33X is, for example, a p-type Si layer (hereinafter referred to as a p-type layer).

For example, two or more regions are formed in the semiconductor layer 33X. In FIG. 15A, three regions 33a, 33b, 33c are formed in the p-type layer 33X. The region 33b is different in crystal structure from the other two regions 33a, 33c. The crystal structures of the two regions 33a, 33c are divided by the insertion of the region 33b, and the crystal structure in one p-type layer is thus discontinuous. The region 33b will hereinafter be referred to as a diffusion buffering region.

The diffusion buffering region 33b is formed to have a thickness ranging, for example, from 1 nm to a level of several atomic layers. When the regions 33a, 33c are made of Si, the diffusion buffering region 33b is made of, for example, at least one of a silicon oxide, silicon nitride, silicon oxynitride and silicon carbide. However, the diffusion buffering region 33b is not limited to these silicon compounds, and may be made of amorphous silicon or a crystal grain boundary of silicon.

The diffusion buffering region 33b is formed by, for example, the in-situ enclosure of an $N_2O$ gas during the formation of the p-type layer (Si layer) 33X. However, instead of the $N_2O$ gas, at least one of a gas containing nitrogen (N), a gas containing oxygen (O), a gas containing hydrogen (H) and a gas containing carbon (C) may be enclosed during the formation of the p-type layer 33X.

Furthermore, for example, N, O, H or C may be added to a predetermined position of the p-type layer 33X by ion implantation after the deposition of the p-type layer 33X.

However, when a compound gas such as the $N_2O$ gas is used, the diffusion buffering region 33b may contain a silicon oxide and a silicon nitride. As in this case, one diffusion buffering region 33b may contain two or more kinds of compounds. It goes without saying that silicon atoms may not react with the enclosed gas and that the diffusion buffering region 33b may be amorphous silicon or a crystal grain boundary.

A metal layer 40 is deposited on the p-type layer 33X including the diffusion buffering region 33b by, for example, the sputter method. The metal layer 40 is a layer for forming a silicide layer on the p-type layer 33X by a chemical reaction between a metal and silicon. A metal selected from the group consisting of titanium (Ti), platinum (Pt) and palladium (Pd) is used for the metal layer 40.

In FIG. 15A, the semiconductor layers 31X, 32X, 33X of the respective conductivity types are not exclusively stacked in the above-mentioned order. It goes without saying that the stacking order of the semiconductor layers 31X, 32X, 33X varies depending on the characteristics of the non-ohmic element to be formed. Although the non-ohmic element including three semiconductor layers is shown here, a non-ohmic element including a metal layer or insulating layer may be used as long as such a non-ohmic element includes one semiconductor layer having a diffusion buffering region 33b. However, in the manufacturing method according to the present embodiment, the semiconductor layer having the diffusion buffering region 33b has to be adjacent to the metal layer for forming the silicide layer.

Figure 15B:
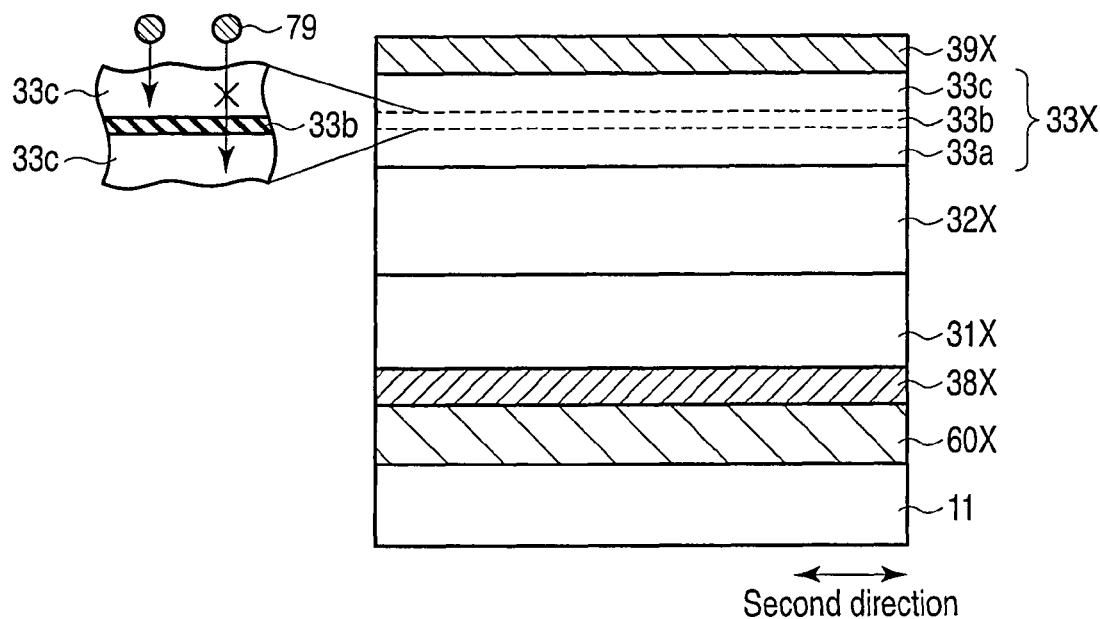
FIG. 15B is a diagram showing one step of the method of manufacturing the resistance change memory according to the embodiment.

FIG. 15B shows the sectional structure of the memory cell array along the second direction in one step of the method of manufacturing the resistance change memory according to the present embodiment.

The metal layer 40 and the p-type layer 33X shown in FIG. 15A are subjected to a heat treatment (silicide treatment) to form a silicide layer. For example, a rapid thermal annealing (RTA) method is used in the heat treatment for the silicide treatment. Then, as shown in FIG. 15B, a conductive layer (silicide layer) 39X is formed on the p-type layer 33X having the diffusion buffering region 33b by a silicide reaction between a metal and silicon.

In this silicide reaction, metal atoms 79 constituting the metal layer diffuse in the p-type layer 33X, and the metal atoms 79 react (combine) with silicon atoms (not shown) constituting the p-type layer 33X.

When the metal atoms 79 constituting the metal layer diffuse in the p-type layer 33X, the movement of the metal atoms 79 from a silicon region 33c to a silicon region 33a is inhibited by the diffusion buffering region 33b.

This is because, as has been explained with FIG. 13A and FIG. 13B, the diffusion buffering region 33b is different in crystal structure from the regions 33a, 33c and the atoms 79 therefore do not easily diffuse (move) into the silicon region 33a from the silicon region 33c.

Therefore, the diffusion of the metal atoms 79 nearly stops in the region 33c above the diffusion buffering region 33b. As a result, the diffusion of the metal atoms 79 in the p-type layer 33X and in the i-type layer 32X under the p-type layer is reduced. Thus, the formation of an impurity level in the p-type layer 33X and the i-type layer 32X due to the metal atoms 79 can be reduced, and the diffusion of the metal atoms into the i-type layer 32X can be prevented. A short circuit between the silicide layer 39X and the i-type layer 32X caused by the agglomeration of the metal atoms 79 can also be prevented.

Figure 15C:
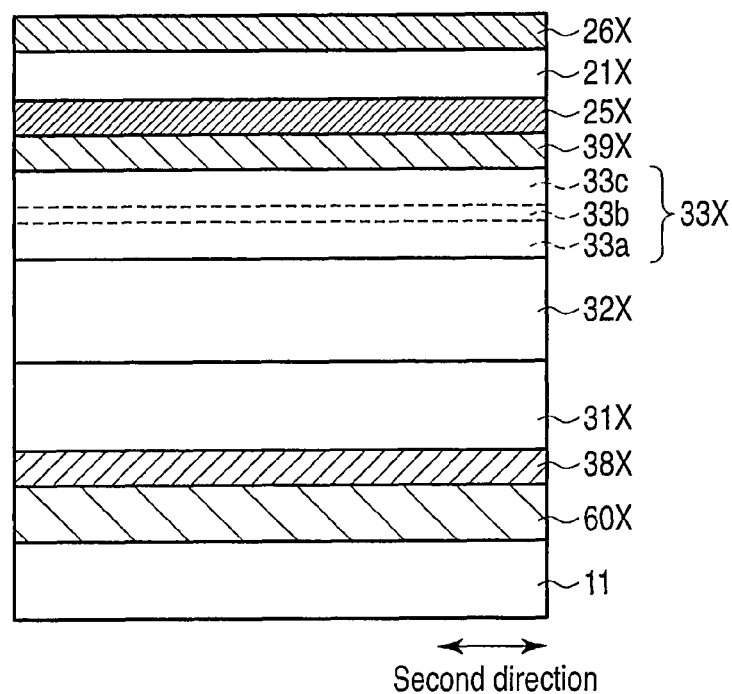
FIG. 15C is a diagram showing one step of the method of manufacturing the resistance change memory according to the embodiment.

FIG. 15C shows the sectional structure of the memory cell array along the second direction in one step of the method of manufacturing the resistance change memory according to the present embodiment.

As shown in FIG. 15C, a first electrode layer 25X, a resistance change film 21X and a second electrode layer 26X are sequentially deposited on the silicide 39X as components of the memory element.

The electrode layers 25X, 26X are formed by, for example, the CVD method or the sputter method. The resistance change film 21X is formed by, for example, the sputter method, the CVD method, an atomic layer deposition (ALD) method, or a metal-organic CVD (MOCVD) method. As described above, for example, a metal oxide, a metal compound or organic matter is used for the resistance change film 21X.

Any material may be used for the electrode layers 25X, 26X as long as characteristics of such a material allow the resistance change film 21X to reversibly changes its resistance value due to externally provided energy (e.g., a voltage, current or heat) and retain the changed resistance value in a nonvolatile manner. However, when the reversible and nonvolatile change of the resistance value of the resistance change film 21X is provided by a combination of the resistance change film 21X and the electrode layers 25X, 26X, a proper combination of materials is selected for the electrode layers 25X, 26X and the resistance change film 21X so that the above-mentioned characteristics can be obtained. The resistance change film 21X may be formed at a temperature of 600° C. or more depending on its material and formation method.

A diffusion preventing layer or an adhesive layer may be separately provided between the electrode layer 25X and the silicide layer 39X. For example, TiN may be formed between the electrode layer 25X and the silicide layer 39X. The electrode layer 25X and the silicide layer 39X may function as the adhesive layers.

Figure 15D:
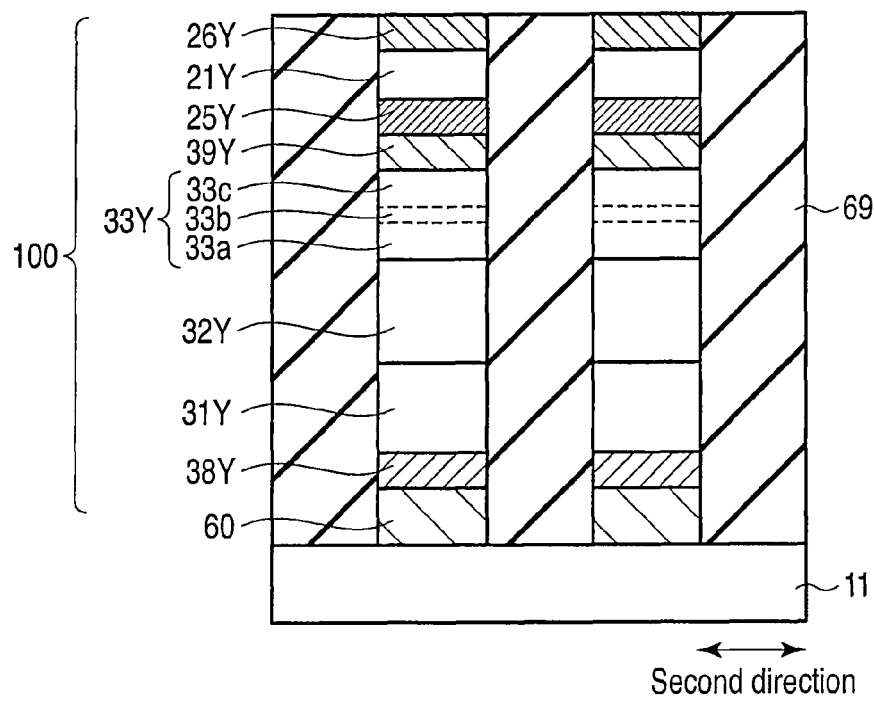
FIG. 15D is a diagram showing one step of the method of manufacturing the resistance change memory according to the embodiment.

FIG. 15D shows the sectional structure of the memory cell array along the second direction in one step of the method of manufacturing the resistance change memory according to the present embodiment.

In the process shown in FIG. 15D, a mask (not shown) having a predetermined shape is formed on an electrode layer 26Y. The mask is made of, for example, tungsten (W). Then, the layers under the mask are sequentially processed by etching that uses a photolithographic method and a reactive ion etching (RIE) method.

In accordance with the shape of the mask, electrode layers 25Y, 26Y, a resistance change film 21Y, a silicide layer 39Y, a p-type layer 33Y, an i-type layer 32Y and an n-type layer 31Y and conductive layer 38Y are formed. Thus, a plurality of stacks 100 are formed on the substrate 11. The formed stacks 100 extend in the first direction. The stacks 100 are divided from one another in the second direction into cell units and are adjacent to one another at predetermined intervals. Thus, a gap is formed between two stacks 100 adjacent in the second direction.

Simultaneously with the processing and formation of the stacks 100, the conductive layer between the stacks 100 and the substrate 11 is processed. Thus, a plurality of interconnect lines 60 extending in the first direction are formed on the substrate 11. The interconnect lines 60 are adjacent to one another in the second direction.

After the mask on the stack 100 is removed, an interlayer insulating film 69 is embedded into the gap between the adjacent stacks 100 by, for example, the CVD method or a coating method. When the mask is made of a metal, the mask may remain on the electrode layer 26Y without being detached.

In this step, the stacks 100 may be divided in the second direction to form cell units, and a interconnect line extending in the first direction may be formed on the cell units to form the memory cell array M1 shown in FIG. 2. However, in a cross-point type memory cell array, it is preferable to form the cell units and the memory cell arrays by the following steps shown in FIG. 15E to FIG. 15G without dividing the stacks 100 in the first direction immediately after the step shown in FIG. 15D.

Figure 15E:
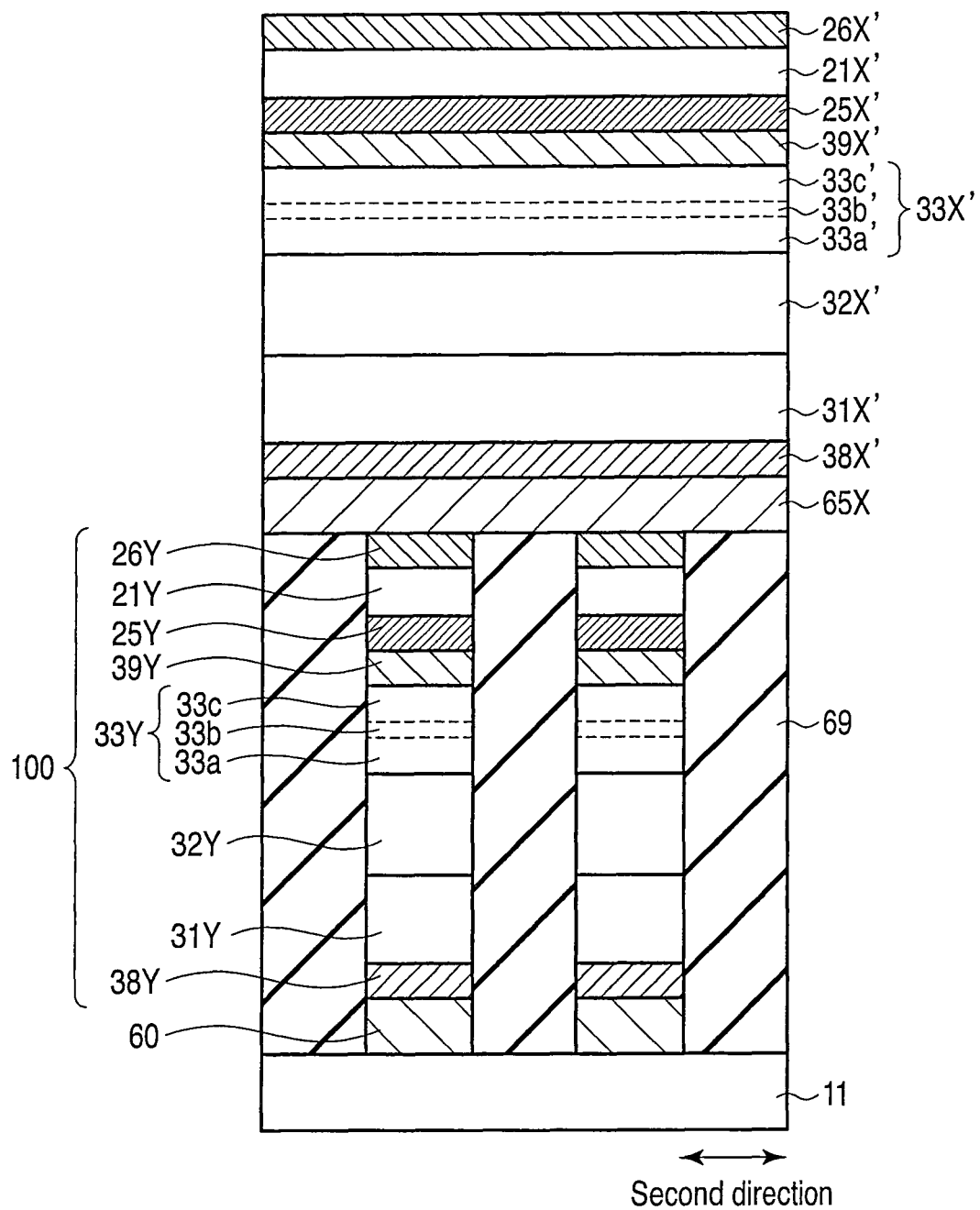
FIG. 15E is a diagram showing one step of the method of manufacturing the resistance change memory according to the embodiment.
Figure 15G:
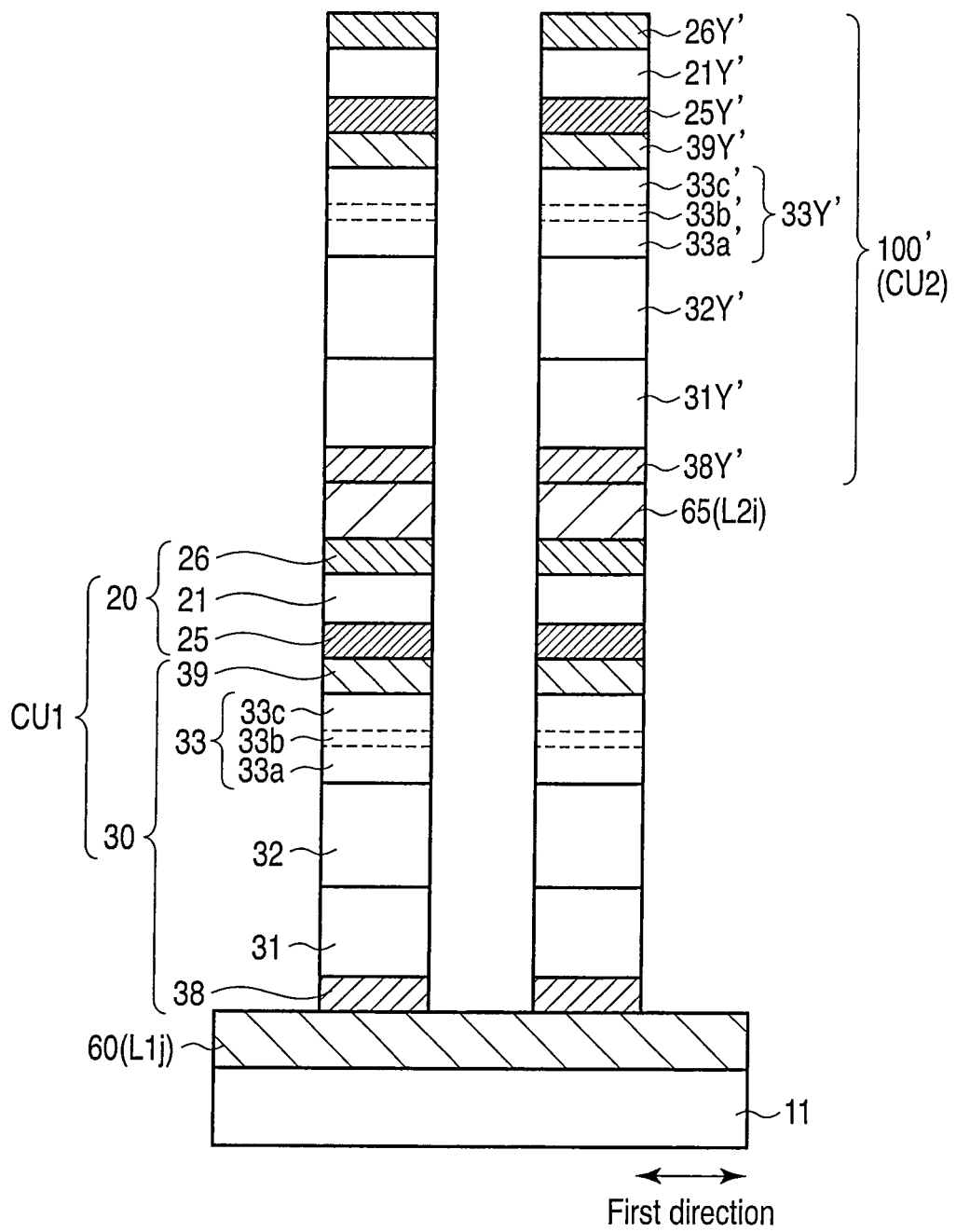
FIG. 15G is a diagram showing one step of the method of manufacturing the resistance change memory according to the embodiment.

FIG. 15E shows the sectional structure of the memory cell array along the second direction in one step of the method of manufacturing the resistance change memory according to the present embodiment. FIG. 15F and FIG. 15G show the sectional structures of the memory cell array along the first direction in one step of the method of manufacturing the resistance change memory according to the present embodiment.

As shown in FIG. 15E and FIG. 15F, a interconnect layer 65X serving as a second interconnect line is deposited on the stack 100 and an interlayer insulating film 69 extending in the second direction by, for example, the sputter method. Then, layers to form the cell unit of a second memory cell array are sequentially deposited on the interconnect layer 65X.

The stacking order of the layers deposited on the interconnect layer 65X varies depending on which of the connection relations indicated by a to p of FIG. 4 two cell units stacked with one interconnect line (interconnect layer 65X) in between have. For ease of explanation, the two cell units have the connection relation indicated by a of FIG. 4 in the case described here. That is, in the example shown in FIG. 15E and FIG. 15F, the stacking order of layers 38X', 31X', 32X', 33X', 39X', 25X', 21X', 26X' on the interconnect layer 65X is the same as the stacking order of the layers constituting the stack 100.

Details are as follows: Three silicon layers 31X', 32X', 33X' are sequentially deposited on the conductive layer 38X' located on the interconnect layer 65X. A diffusion buffering region 33b' is formed in the silicon layer 33X'. The diffusion buffering region 33b' is provided between two silicon regions 33a', 33c'. The silicide layer 39X' is formed on the silicon layer 33X' having the diffusion buffering region 33b'. The components 25X', 21X', 26X' of the memory element are sequentially deposited on the silicide layer 39X'. The layers stacked on the interconnect layer 65X are formed by the same manufacturing process as the manufacturing process for the layers constituting the stack 100.

The silicon layer (e.g., p-type layer) 33X' in contact with the silicide layer 39X' includes the diffusion buffering region 33b'. Thus, as has been described with FIG. 15B, the diffusion of the metal atoms for forming silicide into the entire silicon layer 33X' is inhibited when the silicide layer 39X' is formed.

FIG. 15G shows the sectional structure of the memory cell array along the first direction in one step of the method of manufacturing the resistance change memory according to the present embodiment.

The layers 26X', 21X', 25X', 39X', 33X', 32X', 31X', 38X', 65X and the underlying stack 100 shown in FIG. 15E and FIG. 15F are processed by the photolithographic technique and the RIE method so that the etching selectivity for the interconnect line 60 may be ensured. In this step, the layers 26X', 21X', 25X', 39X', 33X', 32X', 31X', 38X', 65X and the stack extending in the second direction are divided in the first direction.

Thus, as shown in FIG. 15G, a interconnect line 65 (L2i) extending in the first direction is formed, and a cell unit CU1 is formed between the interconnect line 65 (L2(i)) and the interconnect line 60 (L1(j)) extending in the second direction. When the memory is in operation, one of the two interconnect lines 60, 65 is used as a bit line, and the other is used as a word line.

In the cell unit CU1, a pin diode 30 as a non-ohmic element is formed on the interconnect line 60. As described above, the pin diode 30 has a stack structure composed of an n-type layer 31, an i-type layer 32 and a p-type layer 33. On the silicide layer 39A of the pin diode 30, a memory element 20 is formed.

Moreover, since the layers are etched starting from the top in order, a stack 100' is formed on the cell unit CU1 with the interconnect line 65 in between. The stacks 100' are divided from one another in the first direction. In the step shown in FIG. 15G, the sectional structures of the cell unit CU1 and the stack 100' along the first direction are the same as the sectional structures shown in FIG. 15G, and the stack 100' extends in the second direction.

Interlayer insulating films are embedded into the gap between the cell units CU1 adjacent in the second direction and into the gap between the stacks 100' adjacent in the second direction, respectively.

In the cross-point type memory cell array, after the step shown in FIG. 15G, the stack 100' is processed in the first direction into the cell unit CU2 of the upper (second-layer) memory cell array M2 on the first-layer memory cell array M1 in FIG. 2.

When memory cell arrays are further provided on the stacks 100', the process similar to the process shown in FIG. 15E to FIG. 15G is repeated before a predetermined number of memory cell arrays are stacked.

As shown in FIG. 15E to FIG. 15G, the first-layer memory cell array and the second-layer memory cell array, which are two memory cell arrays stacked on the substrate 11 across the interconnect line, are simultaneously processed. Thus, the processing to form the upper memory cell array and the processing to form the lower memory cell array are carried out in the common step, so that the process of manufacturing the resistance change memory having the cross-point type memory cell array shown in FIG. 2 is simpler and its manufacturing costs are lower than when each memory cell array in each layer (each interconnect level) is processed in the first and second directions.

When silicon is used as the semiconductor layer, the above-described process may additionally include a step of depositing amorphous silicon and then crystallizing amorphous silicon into polysilicon through a heat treatment. The heat treatment for the crystallization of silicon may be carried out for each layer (memory cell array), or one heat treatment may be carried out after a predetermined number of stacked memory cell arrays are formed. The heat treatment for the crystallization of silicon is carried out at a temperature of, for example, about 600° C. to 800° C.

In the steps shown in FIG. 15A and FIG. 15C, without removing the metal layer which has not caused a silicide reaction with the silicon layer, the remaining metal layer may be used as the bottom-side electrode layer 25X of the memory element. For example, as shown in FIG. 16A, a silicide layer 39X is formed between the p-type layer 33X and the metal layer 40 by a silicide reaction between the p-type layer 33X and the metal layer 40. Then, without removing the metal layer 40 which has not caused a silicide reaction, the resistance change film 21X and the second electrode layer 26X are sequentially deposited on the metal layer 40 as components of the memory element. As a result, the metal layer which has not caused a silicide reaction can be used as the lower electrode layer of the memory element, and the process of manufacturing the resistance change memory can be simplified.

Furthermore, in the step shown in FIG. 15A, the diffusion buffering region 33b is formed before the stack 100 is formed.

However, before the silicide layer is formed, the diffusion buffering region 33b may be formed after processing (processing in FIG. 15D) to form the stack 100 is performed. When the diffusion buffering region 33b is formed after the stack 100 is formed, the components of the non-ohmic element are preferably used for the structure stacked on the components of the memory element.

As shown in FIG. 16B, the stack 100 is formed on the substrate 11. Here, the silicon layers 31Y, 32Y, 33Y are stacked on the resistance change film 21Y. Then, O ions or N ions are implanted into the silicon layers by, for example, the ion implantation method, so that the diffusion buffering region 33b is formed in the processed silicon layer 33Y. Subsequently, the metal layer is deposited on the silicon layer 33Y and the interlayer insulating film 69, and a silicide treatment is carried out.

After the stack is processed, an $N_2O$ gas, for example, may be introduced into treatment equipment while the surface of the silicon layer 33Y is being exposed, in order to form a diffusion buffering region on the surface of the silicon layer 33Y. In this case, a silicon layer is separately deposited on the formed diffusion buffering region and on the interlayer insulating film, and a metal layer is deposited on the silicon layer. A silicide layer is formed on the diffusion buffering region by a silicide treatment of the deposited silicon layer and the metal layer. In addition, this silicide layer may be used as a part of the interconnect layer.

In the step shown in FIG. 16B as well, the diffusion of the metal atoms in the entire silicon layer is inhibited during the silicide treatment because the silicon layer includes the diffusion buffering region.

The resistance change memory according to the present embodiment is manufactured by the process described above.

As shown in FIG. 15A and FIG. 15B, the diffusion buffering region 33b is formed in the semiconductor layer (e.g., silicon layer) 33X of the non-ohmic element of the resistance change memory. The diffusion buffering region 33b is different in crystal structure from the other regions in the silicon layer 33X. Therefore, the crystal structure in the silicon layer 33X is discontinuous.

For example, the metal layer for forming the silicide layer is deposited on the silicon layer 33X including the diffusion buffering region 33b. The silicide layer 39X is formed on the semiconductor layer 33X by the silicide treatment of the silicon layer 33X and the metal layer 40.

While the silicide treatment is being carried out, the metal atoms 79 contained in the metal layer 40 diffuse into the region 33c of the silicon layer 33X. On the other hand, the diffusion buffering region 33b formed in the silicon layer 33X inhibits the diffusion of the metal atoms 79 into the region 33a other than the region 33c between the diffusion buffering region 33b and the metal layer 40.

That is, in the method of manufacturing the resistance change memory according to the present embodiment, the movement of the metal atoms 79 is prevented because the crystal structure in the silicon layer 33X is discontinuous. Thus, the movement of the metal atoms 79 from the region 33c to the region 33a beyond the diffusion buffering region 33b is reduced. This inhibits an impurity level derived from the metal atoms from being formed in the silicon layer 33X. In the manufacturing method according to the present embodiment, agglomeration of the metal atoms in the silicon layer is also inhibited.

The formation of the impurity level and the agglomeration in the silicon layer are inhibited. Consequently, deterioration of the reverse bias characteristics of the non-ohmic element can be reduced. For example, the increase of a leak current via the impurity level can be reduced when a reverse bias is applied.

As the agglomeration of the metal atoms randomly occurs, the element characteristics of the cell unit in the memory cell array may greatly vary. However, since the agglomeration can be inhibited in the manufacturing method according to the present embodiment, the variation of the element characteristics can be reduced.

When agglomeration occurs in the semiconductor layer 33, the size of the agglomerated metal atoms may surpass the dimension (thickness) of the semiconductor layer 33 in a direction perpendicular to the surface of the substrate. As a result, the agglomerated metal atoms extend through the semiconductor layer 33, and the silicide layer (conductive layer) 39 and the semiconductor layer 32 are short-circuited by the agglomerated metal atoms. That is, the p-type or n-type semiconductor layer 33 does not function as a component of the non-ohmic element any more, and the non-ohmic property in the input/output characteristics of the non-ohmic element 30 disappears. However, the use of the non-ohmic element including the diffusion buffering region 33b in the resistance change memory according to the present embodiment makes it possible to prevent the metal atoms that cause agglomeration from diffusing into the semiconductor layer 33 and to prevent a short circuit between the silicide layer (conductive layer) 39 and the semiconductor layer 32.

For example, in the non-ohmic element such as a pin diode including the intrinsic semiconductor layer (i-type layer), the intrinsic semiconductor layer is easily influenced by the impurity. Thus, the diffusion buffering region 33b is provided in the semiconductor layer so that the diffusion and agglomeration of the impurity (metal atoms) can be inhibited. This is effective in inhibiting the deterioration and quality change of the intrinsic semiconductor layer.

As in the manufacturing method described above, when the diffusion buffering region 33b is formed in the semiconductor layer, the metal atoms for forming the silicide layer can be inhibited from diffusing into the semiconductor layer during the silicide treatment. Thus, even a material that easily causes the diffusion and agglomeration of the metal atoms can be used as the metal layer for forming the silicide layer, and a silicide layer having a Fermi level (work function) suitable for the silicon layer of the non-ohmic element can be formed on the silicon layer.

Consequently, in the method of manufacturing the resistance change memory according to the present embodiment, it is possible to manufacture a non-ohmic element in which the interface resistance between the semiconductor layer and the conductive layer as an electrode is reduced.

In addition, when the diffusion buffering region 33b is made an insulator, the insulator may inhibit the seepage of the wave function from the conductive layer into the semiconductor layer. As a result, the Fermi level pinning caused between the conductive layer (silicide layer) and the semiconductor layer (silicon layer) can be eased. Therefore, in this case, the height of the Schottky barrier generated between the conductive layer and the silicon layer can be reduced, and the interface resistance between the conductive layer and the silicon layer can be reduced.

In the method of manufacturing the resistance change memory according to the present embodiment, the silicon layer 33X adjacent to the silicide layer (or layer containing metal atoms) does not have to be increased in thickness to ease the diffusion and agglomeration of the metal atoms. That is, the semiconductor layer 33X can be reduced in thickness, and the cell unit can be reduced in thickness. As a result, it is possible to provide a resistance change memory in which the storage density of the memory cell array is improved without increasing the aspect ratio of the cell unit (the gap between the cell units). The increase in processing difficulty can also be inhibited in the process of manufacturing the resistance change memory.

When the non-ohmic element is a pin diode, the thickness of the silicon layer (p-type layer) 33X is reduced, and the thickness of the intrinsic silicon layer (i-type layer) 32X under the layer 33X can be increased accordingly. When a reverse bias is being applied to the pin diode, an electric field within the pin diode can be relaxed as a result of the increase in the thickness of the i-type layer. Thus, the operating characteristics of the resistance change memory can be improved. For example, the reverse current of the pin diode and the power consumption of the memory can be reduced.

The heat treatment for forming the silicide layer has been mainly shown in the example of FIG. 15A to FIG. 15G. However, it goes without saying that the provision of the diffusion buffering region in the semiconductor layer also makes it possible to inhibit the diffusion of the metal atoms contained in the conductive layer into the semiconductor layer when the heat treatment for the crystallization of silicon is carried out. That is, the above-described advantages are brought about not only when the silicide treatment is carried out but also when the conductive layer adjacent to the semiconductor layer including the diffusion buffering region is not a silicide layer.

Furthermore, as has been shown in FIG. 14, the diffusion buffering region 33b formed in the semiconductor layer can also inhibit the diffusion of the donor/acceptor impurity added to the semiconductor layer. Thus, when the diffusion buffering region is formed in the semiconductor layer, element characteristic deterioration due to the diffusion of the donor/acceptor impurity can also be reduced.

As described above, in the method of manufacturing the resistance change memory according to the present embodiment, characteristic deterioration of the non-ohmic element can be inhibited. Moreover, in the method of manufacturing the resistance change memory according to the present embodiment, it is possible to provide a resistance change memory in which the thickness of the non-ohmic element can be reduced.

(4) Modification

A modification of the resistance change memory according to the present embodiment is described with FIG. 17 to FIG. 19. FIG. 17 to FIG. 19 show the sectional structure of a cell unit in the present modification.

As has been described with FIG. 13A and FIG. 13B, the number of metal atoms diffused in the region 33c above the diffusion buffering region 33b is greater than the number of metal atoms diffused in the region 33a under the diffusion buffering region 33b. Thus, in one semiconductor layer 33, the region 33a may be different in crystal structure from the region 33b.

When the metal atoms diffuse into the region above the diffusion buffering region 33b, the composition of this region may be close to the composition of the silicide layer 39. Thus, as shown in FIG. 17, the non-ohmic element (e.g., pin diode) may have a structure in which the silicide layer 39 is substantially in contact with the upper surface of the diffusion buffering region 33b. In this case, the diffusion buffering region 33b is provided at the top of the semiconductor layer 33.

As shown in FIG. 18, two or more diffusion buffering regions $33b_1$, $33b_2$ may be provided in one semiconductor layer 33. When the diffusion buffering regions $33b_1$, $33b_2$ are thus provided in one semiconductor layer 33, there is a higher effect of inhibiting the diffusion of the metal atoms/impurity in the semiconductor layer.

The metal atoms in the conductive layer 38 on the bottom side of the non-ohmic element may diffuse into the semiconductor layer on the conductive layer 38. In order to inhibit the metal atoms derived from the bottom-side conductive layer 38 from diffusing into the semiconductor layer, a diffusion buffering region 31b may be provided in the semiconductor layer (e.g., silicon layer) 31 on the bottom side of the non-ohmic element 30 as shown in FIG. 19. The conductive layer 38 may be a silicide layer or any conductive metal compound other than the silicide layer. It goes without saying that the diffusion buffering regions may be provided in both of the semiconductor layers on the top side and bottom side of the non-ohmic element, respectively.

In the modification of the resistance change memory according to the present embodiment, advantages similar to the above-described advantages are brought about, and characteristic deterioration of the non-ohmic element can be inhibited.

(5) Material Examples

Examples of materials used for the cell unit in the resistance change memory according to the present embodiment are described below.

The resistance change memory according to the present embodiment has been described above mainly citing silicon as an example of the material for the semiconductor layer that constitutes the non-ohmic element. However, any materials other than the material containing silicon as the main component may be used for the semiconductor layer as a constituent part of the cell unit as long as such materials are semiconducting materials. That is, instead of silicon and silicon germanium, a substance can be selected from the group consisting of C, GaAs, a semiconductor oxide, a semiconductor nitride, a semiconductor carbide and a semiconductor sulfide.

The p-type semiconductor layer is preferably made of one or a combination of substances selected from the group consisting of p-type Si, $TiO_2$, $ZrO_2$, $InZnO_x$, ITO, $SnO_2$ containing Sb, p-type ZnO, ZnO containing Al, $AgSbO_3$, $InGaZnO_4$ and $ZnO$—$SnO_2$.

The n-type semiconductor layer is preferably made of one or a combination of substances selected from the group consisting of n-type Si, $NiO_x$, ZnO, $Rh_2O_3$, ZnO containing N, ZnO containing In and $La_2CuO_4$.

An insulator (insulating layer) may be contained in the cell unit including the non-ohmic element and memory element. Moreover, the diffusion buffering region 33b provided in the semiconductor layer 33 of the non-ohmic element 30 may be an insulator. The insulator contained in the cell unit is selected from, for example, the following materials.

a) Oxides $SiO_2$, $Al_2O_3$, $Y_2O_3$, $La_2O_3$, $Gb_2O_3$, $Ce_2O_3$, $CeO_2$, $Ta_2O_5$, $HfO_2$, $ZrO_2$, $TiO_2$, HfSiO, HfAlO, ZrSiO, ZrAlO, AlSiO $AB_2O_4$ However, A and B are the same element or different elements, and are one or a combination of substances selected from the group consisting of Al, Sc, Ti, V, Cr, Mn, Fe, Co, Ni, Cu, Zn, Ga and Ge.

For example, $Fe_3O_4$, $FeAl_2O_4$, $Mn_{1+x}Al_{2-x}O_{4+y}$, $Co_{1+x}Al_{2-x}O_{4+y}$, or $MnO_x$.

$ABO_3$

However, A and B are the same element or different elements, and are one or a combination of substances selected from the group consisting of Al, La, Hf, Ta, W, Re, Os, Ir, Pt, Au, Hg, Tl, Pb, Bi, Ce, Pr, Nd, Pm, Sm, Eu, Gd, Tb, Dy, Ho, Er, Tm, Yb, Lu, Sc, Ti, V, Cr, Mn, Fe, Co, Ni, Cu, Zn, Ga, Ge, Y, Zr, Nb, Mo, Tc, Ru, Rh, Pd, Ag, Cd, In and Sn.

For example, $LaAlO_3$, $SrHfO_3$, $SrZrO_3$ or $SrTiO_3$.

b) Oxynitrides

SiON, AlON, YON, LaON, GdON, CeON, TaON, HfON, ZrON, TiON, LaAlON, SrHfON, SrZrON, SrTiON, HfSiON, HfAlON, ZrSiON, ZrAlON, AlSiON

Substances in which part of the oxygen element of the above-mentioned oxides of a) is substituted for a nitrogen element The Si-based insulating films made of, for example, $SiO_2$, SiN or SiON includes insulating films in which the concentration of the oxygen element and/or nitrogen element is $1 \times 10^{18}/cm^3$ or more.

A conductive line (interconnect line) using as a word line/bit line is made of one or a combination of substances selected from the group consisting of W, WN, Al, Ti, V, Cr, Mn, Fe, Co, Ni, Cu, TiN, $WSi_x$, $TaSi_x$, $PdSi_x$, $ErSi_x$, $YSi_x$, $PtSi_x$, $HfSi_x$, $NiSi_x$, $CoSi_x$, $TiSi_x$, $VSi_x$, $XrSi_x$, $MnSi_x$ and $FeSi_x$ (however, $x>0$). When the conductive line is formed of a plurality of substances, constituent parts of the conductive line may be made up of mixed crystal layers of a plurality of substances.

The electrode (electrode layer/conductive layer) of the non-ohmic element or memory element includes, for example, a single metal element or a mixture of a plurality of metal elements, silicide, oxide and nitride. Specifically, the electrode (electrode layer/conductive layer) is made of one or a combination of substances selected from the group consisting of Pt, Au, Ag, Ru, Ir, Ti, V, Cr, Mn, Fe, Co, Ni, Cu, Al, Rh, RuN, TiN, TaN, TiAlN, TaAlN, $SrRuO_x$, $LaNiO_x$, $PtIrO_x$, $PtRhO_x$, $SiTiO_x$, $WSi_x$, $TaSi_x$, $PdSi_x$, $PtSi_x$, $IrSi_x$, $ErSi_x$, $YSi_x$, $HfSi_x$, $NiSi_x$, $CoSi_x$, $TiSi_x$, $VSi_x$, $CrSi_x$, $MnSi_x$ and $FeSi_x$ (however, $x>0$). When the electrode (electrode layer/conductive layer) is formed by using a plurality of substances, constituent parts of the electrode may be made up of mixed crystal layers of a plurality of substances.

If one or a combination of two or more substances selected from the group consisting of $TiSi_x$, $VSi_x$, $CrSi_x$, $MnSi_x$, $FeSi_x$, $CoSi_x$, $NiSi_x$, $NdSi_x$, $MoSi_x$, $HfSi_x$, $TaSi_x$, $WSi_x$, $PdSi_x$, $IrSi_x$, $PtSi_x$, $RhSi_x$, $ReSi_x$ and $OsSi_x$ (however, $x>0$) is used as a silicide for the p-type silicon layer (p-type layer), the interface resistance between the p-type silicon layer and the silicide layer can be reduced. When two or more silicides are used to form the electrode for the p-type silicon layer, the electrode layer may be made up of mixed crystal layers of two or more silicides.

If one or a combination of two or more substances selected from the group consisting of $TiSi_x$, $VSi_x$, $CrSi_x$, $MnSi_x$, $FeSi_x$, $CoSi_x$, $NiSi_x$, $NdSi_x$, $MoSi_x$, $HfSi_x$, $TaSi_x$, $YSi_x$, $YbSi_x$, $ErSi_x$, $HoSi_x$, $DySi_x$, $GdSi_x$ and $TbSi_x$ (however, x>0) is used as a silicide for the n-type silicon layer (n-type layer), the interface resistance between the n-type silicon layer and the silicide layer can be reduced. When two or more silicides are used to form the electrode for the n-type silicon layer, the electrode layer may be made up of mixed crystal layers of two or more silicides.

Moreover, one silicide may include two or more metal elements.

The electrode (electrode layer/conductive layer) may have a function of the diffusion preventing layer or the adhesive layer.

Instead of the above-mentioned materials, the electrode layer of the memory element or the non-ohmic element may be made of one or a combination of substances selected from the group consisting of a). a single element or a mixture of a plurality of metal elements, b). a compound metal as an oxide, carbide, boride, nitride, or silicide, and c). $TiN_x$, $TiC_x$, $TiB_x$, $TiSi_x$, $TaC_x$, $TaB_x$, $TaN_x$, $WC_x$, $WB_x$, W, $WSi_x$, $TaSi_x$, $LaB_x$, $LaN_x$, $LsSi_x$, $HfSi_x$, Hf, $YSi_x$, $ErSi_x$, $NiSi_x$, $PtSi_x$, $PdSi_x$, $CoSi_x$, $MnSi_x$, $CrSi_x$ and $FeSi_x$ (however, x>0).

(6) Conclusion

According to the present embodiments, characteristic deterioration of the non-ohmic element used in the resistance change memory can be inhibited.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A resistance change memory comprising:
a first interconnect line extending in a first direction;
a second interconnect line extending in a second direction intersecting with the first direction;
a cell unit which is provided at the intersection of the first interconnect line and the second interconnect line and which includes a memory element and a non-ohmic element that are connected in series;
the non-ohmic element having a first semiconductor layer including at least one diffusion buffering region, the at least one diffusion buffering region having a material including atoms of the first semiconductor layer; and
a conductive layer disposed adjacent to the first semiconductor layer,
wherein the diffusion buffering region is different in crystal structure from a portion of the first semiconductor layer other than the diffusion buffering region, and the conductive layer is formed of a silicide layer.

2. The resistance change memory according to claim 1, wherein
the diffusion buffering region is made of at least one material selected from the group consisting of an oxide, a nitride, an oxynitride and a carbide of constituent atoms of the first semiconductor layer.

3. The resistance change memory according to claim 1, wherein
the first semiconductor layer is made of a material selected from the group consisting of silicon, silicon germanium, silicon carbide and silicon tin.

4. The resistance change memory according to claim 1, wherein
the diffusion buffering region is made of a material selected from the group consisting of silicon germanium, silicon carbide, silicon tin, a single crystal, polycrystal, an amorphous substance and a crystal grain boundary.

5. The resistance change memory according to claim 1, wherein
the conductive layer is in contact with a resistance change film included in the memory element.

6. The resistance change memory according to claim 1, wherein
the first semiconductor layer includes first and second semiconductor regions, and
the diffusion buffering region is provided between the first and second semiconductor regions.

7. The resistance change memory according to claim 6, wherein
the first semiconductor region is in contact with the conductive layer,
the concentration of an impurity derived from the conductive layer in the first semiconductor region is higher than the concentration of an impurity derived from the conductive layer in the second semiconductor region.

8. The resistance change memory according to claim 1, wherein
the diffusion buffering region is in contact with the conductive layer.

9. The resistance change memory according to claim 1, wherein
the conductive layer is provided on the first semiconductor layer,
the first semiconductor layer is provided on a second semiconductor layer, the second semiconductor layer is an intrinsic semiconductor layer.

10. The resistance change memory according to claim 1, wherein
the diffusion buffering region is made of an insulator.

11. The resistance change memory according to claim 1, wherein
the first semiconductor layer includes two or more diffusion buffering regions.

12. The resistance change memory according to claim 1, wherein
the conductive layer is made of a material selected from the group consisting of $WSi_x$, $TaSi_x$, $PdSi_x$, $PtSi_x$, $IrSi_x$, $ErSi_x$, $YSi_x$, $HfSi_x$, $NiSi_x$, $CoSi_x$, $TiSi_x$, $VSi_x$, $CrSi_x$, $MnSi_x$ and $FeSi_x$ (however, x>0).

13. A method of manufacturing a resistance change memory comprising:
forming a metal layer and a semiconductor layer above a substrate, the semiconductor layer being adjacent to the metal layer and including a diffusion buffering region to inhibit the diffusion of constituent atoms of the metal layer, the at least one diffusion buffering region having a material including atoms of the first semiconductor layer;

reacting a part of the semiconductor layer above the diffusion buffering region to form a conductive layer adjacent to the semiconductor layer using a heat treatment of the semiconductor layer and the metal layer; and processing a stack including the conductive layer, the semiconductor layer and a resistance change film to form a memory element including the resistance change film and a non-ohmic element.

14. The method of manufacturing a resistance change memory according to claim 13, wherein the diffusion buffering region is different in crystal structure from a portion of the semiconductor layer other than the diffusion buffering region, and the diffusion buffering region is made of at least one material selected from the group consisting of an oxide, a nitride, an oxynitride and a carbide of constituent atoms of the semiconductor layer.

15. The method of manufacturing a resistance change memory according to claim 13, wherein the conductive layer is formed of silicide.

* * * * *